(12) United States Patent
Freer et al.

(10) Patent No.: US 10,514,420 B2
(45) Date of Patent: Dec. 24, 2019

(54) SYSTEMS AND METHODS FOR TESTING GROUND FAULT CIRCUIT INTERRUPTER BREAKERS WITHIN ENCLOSURES

(71) Applicants: Benjamin Avery Freer, Syracuse, NY (US); Stephan P Iannce, Clay, NY (US); Joseph Michael Manahan, Manlius, NY (US)

(72) Inventors: Benjamin Avery Freer, Syracuse, NY (US); Stephan P Iannce, Clay, NY (US); Joseph Michael Manahan, Manlius, NY (US)

(73) Assignee: EATON INTELLIGENT POWER LIMITED, Dublin (IE)

( * ) Notice: Subject to any disclaimer, the term of this patent is extended or adjusted under 35 U.S.C. 154(b) by 428 days.

(21) Appl. No.: 15/366,163

(22) Filed: Dec. 1, 2016

(65) Prior Publication Data

US 2017/0187180 A1 Jun. 29, 2017

Related U.S. Application Data

(60) Provisional application No. 62/271,789, filed on Dec. 28, 2015.

(51) Int. Cl.
*H02H 3/16* (2006.01)
*H01H 71/04* (2006.01)
(Continued)

(52) U.S. Cl.
CPC ....... *G01R 31/333* (2013.01); *G01R 31/3333* (2013.01); *H01H 83/04* (2013.01);
(Continued)

(58) Field of Classification Search
CPC ...... G01R 31/333; H02H 3/335; H01H 9/042; H01H 13/023; H01H 83/04
(Continued)

(56) References Cited

U.S. PATENT DOCUMENTS 3,898,557 A 8/1975 Strock
5,204,798 A * 4/1993 Scott ................ H01H 71/0228
361/643

(Continued)

FOREIGN PATENT DOCUMENTS

RU 2013141954 3/2015

OTHER PUBLICATIONS

S. Chernyakova, International Search Report and Written Opinion issued in PCT/US2017/020461, completion date May 31, 2017, dated Jun. 8, 2017, 7 pages, Federal Institute of Industrial Property, Moscow, Russia.

(Continued)

*Primary Examiner* — Zeev V Kitov
(74) *Attorney, Agent, or Firm* — King & Spalding LLP

(57) ABSTRACT

A ground fault circuit interrupter (GFCI) breaker testing system can include an enclosure having at least one wall that forms a cavity. The system can also include at least one GFCI breaker disposed within the cavity. The system can further include a sensing circuit assembly having at least one switch, where the at least one switch is electrically coupled to the at least one GFCI breaker. The system can also include a user interface assembly disposed, at least in part, outside the cavity, where the user interface assembly is coupled to the sensing circuit assembly, where the user interface assembly instructs the at least one switch to test the at least one GFCI breaker.

20 Claims, 7 Drawing Sheets

(51) Int. Cl.
  *H01H 71/02* (2006.01)
  *H01H 13/02* (2006.01)
  *G06F 3/0362* (2013.01)
  *G06F 3/0354* (2013.01)
  *G01R 31/333* (2006.01)
  *H02H 3/33* (2006.01)
  *H01H 83/04* (2006.01)
  *H01H 9/04* (2006.01)

(52) U.S. Cl.
  CPC ............ *H02H 3/335* (2013.01); *H01H 9/042* (2013.01); *H01H 13/023* (2013.01)

(58) Field of Classification Search
  USPC .......................................................... 361/42
  See application file for complete search history.

(56) References Cited

U.S. PATENT DOCUMENTS

| | | |
|---|---|---|
| 5,334,939 A | 8/1994 | Yarbrough |
| 5,796,636 A | 8/1998 | Andrews |
| 6,433,555 B1* | 8/2002 | Leopold ................. H01H 83/04 324/509 |
| 7,268,558 B2 | 9/2007 | Mills et al. |
| 7,336,457 B2* | 2/2008 | Liscinsky, III ........ H02H 3/044 361/115 |
| 2004/0012393 A1 | 1/2004 | Schmalz et al. |
| 2004/0174173 A1 | 9/2004 | Elms et al. |
| 2005/0212526 A1 | 9/2005 | Blades |
| 2007/0188290 A1* | 8/2007 | Nakasuji ............ H01H 36/0066 337/1 |
| 2009/0021879 A1 | 1/2009 | Rivers, Jr. et al. |
| 2009/0206059 A1 | 8/2009 | Kiko |

OTHER PUBLICATIONS

Machine Translation of RU 2013141954 abstract via LexisNexis Total Patent, Jul. 18, 2017, 2 pages.

A. Semenova, International Search Report and Written Opinion issued in PCT/US2016/064326, completion date Apr. 3, 2017, dated Apr. 6, 2017, 7 pages, Federal Institute of Industrial Property, Moscow, Russia.

* cited by examiner

SYSTEMS AND METHODS FOR TESTING GROUND FAULT CIRCUIT INTERRUPTER BREAKERS WITHIN ENCLOSURES

CROSS-REFERENCE TO RELATED APPLICATIONS

This application claims priority under 35 U.S.C. § 119 to U.S. Provisional Patent Application Ser. No. 62/271,789, titled "Systems and Methods For Testing Ground Fault Circuit Interrupter Breakers Within Enclosures" and filed on Dec. 28, 2015, the entire contents of which are hereby incorporated herein by reference.

TECHNICAL FIELD

The present disclosure relates generally to ground fault circuit interrupter (GFCI) breakers, and more particularly to systems, methods, and devices for testing GFCI breakers disposed within enclosures.

BACKGROUND

Enclosures are used in a number of applications and have a number of different sizes and configurations. Such enclosures have one or more electrical devices and/or mechanical devices disposed therein. An example of such a device is a GFCI breaker. The breaker portion of the device is a switch that controls when power is sent to downstream devices. The GFCI portion of the device is a fail-safe feature that automatically opens the breaker when a ground fault is detected. In many cases, an enclosure can have multiple GFCI breakers disposed therein.

SUMMARY

In general, in one aspect, the disclosure relates to a ground fault circuit interrupter (GFCI) breaker testing system. The system can include an enclosure having at least one wall that forms a cavity. The system can also include at least one GFCI breaker disposed within the cavity. The system can further include a sensing circuit assembly having at least one switch, where the at least one switch is electrically coupled to the at least one GFCI breaker. The system can also include a user interface assembly disposed, at least in part, outside the cavity, where the user interface assembly is coupled to the sensing circuit assembly, where the user interface assembly instructs the at least one switch to test the at least one GFCI breaker.

In another aspect, the disclosure can generally relate to a user interface assembly. The user interface assembly can include a controller coupled to the user interface, where the controller is configured to communicate with a sensing circuit assembly disposed within a cavity of an enclosure, where the sensing circuit assembly includes at least one switch, where the controller instructs the at least one switch to operate so that at least one GFCI breaker disposed within the cavity of the enclosure is tested. The user interface assembly can also include a user interface assembly coupled to the controller, where the user interface communicates with a user regarding the at least one GFCI breaker disposed within the cavity of the enclosure.

In yet another aspect, the disclosure can generally relate to a sensing circuit assembly. The sensing circuit assembly can include a circuit board disposed within a cavity of an enclosure. The sensing circuit assembly can also include a number of switches disposed on the circuit board, where each switch is electrically coupled to a GFCI breaker, where each GFCI breaker is disposed within the cavity of the enclosure. The switches are configured to be coupled to a controller, where the controller is configured to further be coupled to a user interface assembly, where the controller is configured to operate each of the switches based on instructions received from the user interface assembly.

These and other aspects, objects, features, and embodiments will be apparent from the following description and the appended claims.

BRIEF DESCRIPTION OF THE DRAWINGS

The drawings illustrate only example embodiments and are therefore not to be considered limiting in scope, as the example embodiments may admit to other equally effective embodiments. The elements and features shown in the drawings are not necessarily to scale, emphasis instead being placed upon clearly illustrating the principles of the example embodiments. Additionally, certain dimensions or positionings may be exaggerated to help visually convey such principles. In the drawings, reference numerals designate like or corresponding, but not necessarily identical, elements.

DETAILED DESCRIPTION

Figure 1:
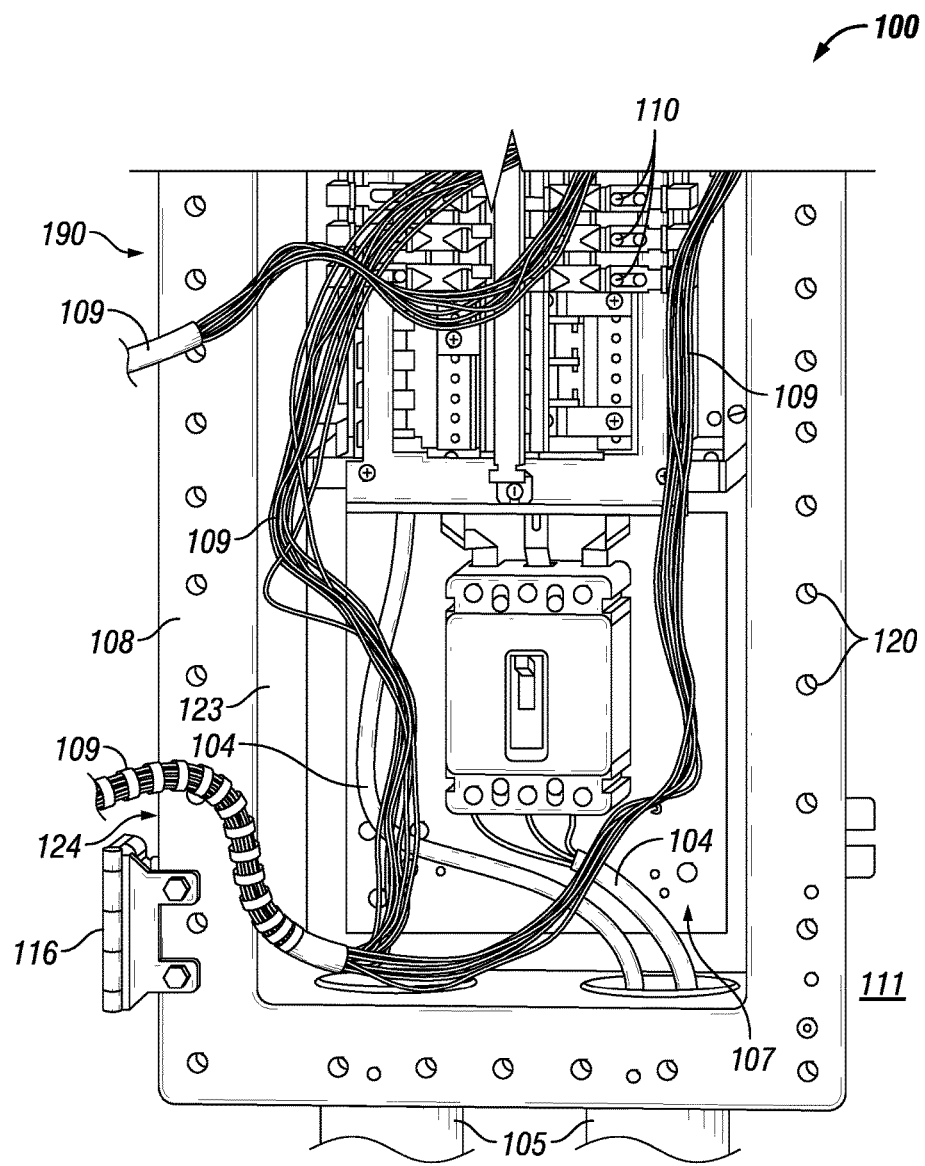
FIG. 1 shows a front view of an enclosure in which a number of GFCI breakers are disposed in a manner currently known in the art.

In general, example embodiments provide systems, methods, and devices for systems for testing GFCI breakers within an enclosure. Example systems for testing GFCI breakers within an enclosure can be used in any of a number of enclosures, including but not limited to junction boxes, circuit panels, and control panels. Further, the enclosures in which example systems for testing GFCI breakers are used can be located in one or more of any of a number of environments, including but not limited to hazardous (e.g., explosive) environments, indoors, outdoors, cold temperatures, hot temperatures, high humidity, marine environments, and low oxygen environments. As described herein, an enclosure can also be called an electrical enclosure.

In addition, the size (e.g., the voltage rating, the current rating) and purpose of GFCI breakers used with example systems can vary. For example, a number of GFCI breakers that are coupled to an example user interface assembly can be rated for 120 VAC and 30 A maximum current. Further, multiple GFCI breakers that are coupled an example user interface assembly can be located in more than one enclosure rather than in a single enclosure. In such a case, the multiple enclosures can be located proximate to each other. For example, the different GFCI breakers can be located in different compartments of a single motor control center (or similar location where multiple compartments are located adjacent to each other).

As another example, GFCI breakers used with example systems can be designed to protect humans with a 5 mA discrepancy trip (also sometimes called a leakage current). In such a case, the example system can verify that the GFCI breakers remain suitable for protecting humans by monitoring the circuit discrepancy. As yet another example, GFCI breakers used with example systems can be designed for heat tracing, which protects equipment with a 30 mA discrepancy trip (also sometimes called a leakage current). In such a case, the example system can, in addition to verifying that the GFCI breakers remain suitable for protecting humans, predict pipeline performance (flow) issues by determining what heat trace elements are drawing more load or have failed in relation to the overall heat trace system.

While example embodiments are directed for use with GFCI breakers as described herein, example systems described herein can be used with any of a number of devices that are located in a single enclosure (or multiple adjacent enclosures) and that require periodic testing and/or other interaction by a user. For example, the National Fire Protection Association (NFPA) requires that circuit breakers are tested on a periodic basis (e.g., every 30 days, in accordance with the manufacturer's instructions). Example embodiments described herein can be used in new enclosures. In addition, some example embodiments can be used to retrofit existing systems, currently used in the art, to test GFCI breakers.

The GFCI breakers described herein can be designed for any type of voltage (e.g., alternating current, direct current). In addition, the GFCI breakers described herein can be designed for any level of voltage (e.g., 120V, 480V, 4 kV). A user may be any person that interacts, directly or indirectly, with enclosures and/or GFCI breakers. Examples of a user may include, but are not limited to, an engineer, an electrician, an instrumentation and controls technician, a mechanic, an operator, a consultant, a contractor, and a manufacturer's representative.

GFCI breakers can be used in one or more of a number of applications. For example, GFCI breakers can be used for heat tracing, which raises or maintains the temperature of devices (e.g., pipes, vessels, motor controls) using heating elements. Heat tracing can be critical to ensure proper operation of the devices and/or to avoid catastrophic failure of the device and associated processes/equipment. Ground shorting is a significant risk in heat tracing applications, and so the proper operation of GFCI breakers used in heat tracing applications is critical. Heat tracing can be approximately two times a threshold value compared to a ground fault.

In the foregoing figures showing example embodiments of systems for testing GFCI breakers within an enclosure, one or more of the components shown may be omitted, repeated, and/or substituted. Accordingly, example embodiments of systems for testing GFCI breakers within an enclosure should not be considered limited to the specific arrangements of components shown in any of the figures. For example, features shown in one or more figures or described with respect to one embodiment can be applied to another embodiment associated with a different figure or description.

In certain example embodiments, enclosures in which example systems for testing GFCI breakers within an enclosure are used are subject to meeting certain standards and/or requirements. For example, the NFPA, the National Electric Code (NEC), the National Electrical Manufacturers Association (NEMA), the International Electrotechnical Commission (IEC), and the Institute of Electrical and Electronics Engineers (IEEE) can set standards as to electrical enclosures, wiring, and electrical connections. Use of example embodiments described herein meet (and/or allow a corresponding device and/or electrical enclosure to meet) such standards when required. In some (e.g., PV solar) applications, additional standards particular to that application may be met by the electrical enclosures in which example systems for testing GFCI breakers within an enclosure are used.

As discussed above, example embodiments can be used in hazardous environments or locations. Examples of a hazardous location in which example embodiments can be used can include, but are not limited to, an airplane hangar, a drilling rig (as for oil, gas, or water), a production rig (as for oil or gas), a refinery, a chemical plant, a power plant, a mining operation, and a steel mill. A hazardous environment can include an explosion-proof environment, which would require an enclosure with an example systems for testing GFCI breakers to meet one or more requirements, including but not limited to flame paths.

In addition to hazardous environments, an enclosure that includes an example user interface assembly for testing GFCI breakers can be located in any other type of environment (e.g., indoors, outdoors, under water, in a climate controlled room). As defined herein, a hazardous location is any location where the enclosure can be exposed to extreme conditions. Extreme conditions can include, but are not limited to, high temperatures, low temperatures, temperature fluctuations, corrosion, humidity, chemicals, vibrations, and dust. More information about hazardous locations and hazardous location enclosures can be found, for example, in Articles 500-506 and Articles 510-517 of the NEC, which is incorporated herein by reference.

Examples of a hazardous location in which example embodiments can be used can include, but are not limited to, an airplane hangar, a drilling rig (as for oil, gas, or water), a production rig (as for oil or gas), a refinery, a chemical plant, a power plant, a mining operation, and a steel mill. A hazardous environment can include an explosion-proof environment, which would require an enclosure with an example system for testing GFCI breakers to meet one or more requirements, including but not limited to flame paths.

An explosion-proof enclosure is a type of hazardous location enclosure. In one or more example embodiments, an explosion-proof enclosure (also known as a flame-proof enclosure) is an enclosure that is configured to contain an explosion that originates inside the enclosure. Further, the explosion-proof enclosure is configured to allow gases from inside the enclosure to escape across joints of the enclosure and cool as the gases exit the explosion-proof enclosure. The joints are also known as flame paths and exist where two surfaces meet and provide a path, from inside the explosion-proof enclosure to outside the explosion-proof enclosure, along which one or more gases may travel. A joint may be a mating of any two or more surfaces. Each surface may be any type of surface, including but not limited to a flat surface, a threaded surface, and a serrated surface.

In one or more example embodiments, an explosion-proof enclosure is subject to meeting certain standards and/or requirements. For example, NEMA sets standards with which an electrical enclosure must comply in order to qualify as an explosion-proof enclosure. Specifically, NEMA Type 7, Type 8, Type 9, and Type 10 enclosures set standards with which an explosion-proof enclosure within certain hazardous locations must comply. For example, a NEMA Type 7 standard applies to electrical enclosures constructed for indoor use in certain hazardous locations. Hazardous locations may be defined by one or more of a number of authorities, including but not limited to the NEC (e.g., Class 1, Division I) and UL (e.g., UL 1203). For example, a Class 1 hazardous area under the National Electric Code is an area in which flammable gases or vapors may be present in the air in sufficient quantities to be explosive.

As a specific example, NEMA standards for an explosion-proof enclosure of a certain size or range of sizes (e.g., greater than 100 in$^3$) may require that in a Group B, Division I area, any flame path of an explosion-proof enclosure must be at least 1 inch long (continuous and without interruption), and the gap between the surfaces cannot exceed 0.0015 inches. Standards created and maintained by NEMA may be found at www.nema.org/stds and are hereby incorporated by reference.

If a component of a figure is described but not expressly shown or labeled in that figure, the label used for a corresponding component in another figure can be inferred to that component. Conversely, if a component in a figure is labeled but not described, the description for such component can be substantially the same as the description for the corresponding component in another figure. The numbering scheme for the various components in the figures herein is such that each component is a three digit number and corresponding components in other figures have the identical last two digits.

In addition, a statement that a particular embodiment (e.g., as shown in a figure herein) does not have a particular feature or component does not mean, unless expressly stated, that such embodiment is not capable of having such feature or component. For example, for purposes of present or future claims herein, a feature or component that is described as not being included in an example embodiment shown in one or more particular drawings is capable of being included in one or more claims that correspond to such one or more particular drawings herein.

Example embodiments of systems for testing GFCI breakers within an enclosure will be described more fully hereinafter with reference to the accompanying drawings, in which example embodiments of systems for testing GFCI breakers within an enclosure are shown. Systems for testing GFCI breakers within an enclosure may, however, be embodied in many different forms and should not be construed as limited to the example embodiments set forth herein. Rather, these example embodiments are provided so that this disclosure will be thorough and complete, and will fully convey the scope of systems for testing GFCI breakers within an enclosure to those of ordinary skill in the art. Like, but not necessarily the same, elements (also sometimes called components) in the various figures are denoted by like reference numerals for consistency.

Terms such as "first", "second", "top", "bottom", "side", "width", "length", "radius", "distal", "proximal", "inner", and "outer" are used merely to distinguish one component (or part of a component or state of a component) from another. Such terms are not meant to denote a preference or a particular orientation, and are not meant to limit embodiments of systems for testing GFCI breakers within an enclosure. In the following detailed description of the example embodiments, numerous specific details are set forth in order to provide a more thorough understanding of the invention. However, it will be apparent to one of ordinary skill in the art that the invention may be practiced without these specific details. In other instances, well-known features have not been described in detail to avoid unnecessarily complicating the description.

FIG. 1 shows a front view of an enclosure in which a number of GFCI breakers are disposed in a manner currently known in the art. Referring now to FIG. 1, the system 100 includes an enclosure 190 and a number of components disposed within the enclosure 190. The enclosure 190 includes one or more walls 123 that form a cavity 107. The enclosure 190 can have an enclosure body 124 that is removably coupled to an enclosure cover (not shown). In this case, the enclosure 190 is in an open position because the enclosure cover is separated from the enclosure body 124. The enclosure 190 is located in an ambient environment 111 (e.g., outdoors, a hazardous environment). The enclosure cover can be secured to the enclosure body 124 in one or more of a number of ways. For example, in this case, the enclosure cover is secured to the enclosure body 124 by a number of fastening devices (not shown) disposed within a number of apertures 120 around the perimeter of an enclosure engagement surface (not shown) (also called a flange) of the enclosure cover and around the perimeter of the enclosure engagement surface 108 (also called a flange 108) of the enclosure body 124.

When the enclosure cover and the enclosure body 124 are in the closed position relative to each other, the enclosure engagement surface 108 of the enclosure body 124 abuts against the enclosure engagement surface of the enclosure cover. When the enclosure 190 is an explosion-proof enclosure, as in this case, a flame path is formed between the enclosure engagement surface 108 of the enclosure body 124 and the enclosure engagement surface of the enclosure cover. As discussed above, the enclosure body forms a cavity 107 inside of which one or more components (e.g., GFCI breakers 110, electrical wires 109) are disposed. When the enclosure cover and the enclosure body 124 are in the closed position relative to each other, then the cavity 107 is substantially enclosed.

A fastening device may be one or more of a number of fastening devices, including but not limited to a bolt (which may be coupled with a nut), a screw (which may be coupled with a nut), and a clamp. In addition, one or more optional hinges 116 can be secured to one side of the enclosure cover and a corresponding side of the enclosure body 124 so that, when all of the fastening devices are removed, as shown in FIG. 1, the enclosure cover may swing outward (i.e., an open position) from the enclosure body 124 using the one or more hinges 116. In one or more example embodiments, there are no hinges, and the enclosure cover can be completely separated from the enclosure body 124 when all of the fastening devices are removed.

The enclosure cover and the enclosure body 124 may be made of any suitable material, including metal (e.g., alloy, stainless steel), plastic, some other material, or any combination thereof. The enclosure cover and the enclosure body 124 may be made of the same material or different materials. In one or more example embodiments, on the end of the enclosure body 124 opposite the enclosure cover, one or more mounting brackets (hidden from view) are affixed to the exterior of the enclosure body 124 to facilitate mounting the enclosure 190. Using the mounting brackets, the enclosure 190 may be mounted to one or more of a number of surfaces and/or elements, including but not limited to a wall, a control cabinet, a cement block, an I-beam, and a U-bracket.

There can be one or more conduits 105 that are coupled to a wall 123 of the enclosure body 124 of the enclosure 190. Each conduit 105 can have one or more electrical cables 104 disposed therein, where one end of an electrical cable 104 is electrically coupled to one or more devices (e.g., an electrical device) disposed within the enclosure 190.

As stated above, if the enclosure 190 is an explosion-proof enclosure, certain applicable industry standards must be met. For example, in order to maintain a suitable flame path between the flange of the enclosure cover and the flange 108 of the enclosure body 124, all of the fastening devices must be properly engineered, machined, applied, and tightened within all of the apertures 120. If one or more of the fastening devices is missing and/or if one or more of the fastening devices is not tightened properly (e.g., is tightened to the proper torque), then the flame path may not be compliant with applicable safety standards. This can lead to catastrophic results.

Because some enclosures, such as the enclosure 190 of FIG. 1, have so many fastening devices (in this case, over 30), it can be extremely time-consuming to remove all of the fastening devices to open the enclosure 190, access the cavity 107, and properly re-couple all of the fastening devices to return the enclosure 190 to a closed state. Also, as stated above, certain devices (e.g., GFCI breakers 110) that are located inside the cavity 107 of the enclosure 190 must be tested periodically to ensure that those devices are operating properly. If these tests are not performed on these devices within a prescribed period of time relative to the most recent test, applicable standards and/or regulations are violated. The standards and/or regulations for such devices are designed to promote safety, and so a violation of these standards and/or regulations can result in significant damage.

However, because certain enclosures 190 in which devices such as the GFCI breakers 110 are located are so difficult and time-consuming to open, a means for testing is mounted on the outside of the enclosure 190 so that the GFCI breakers 110 can be tested without a user having to access the cavity 107 of the enclosure 190. In the current art, a combination of at least two switches (not shown) and a pushbutton (also not shown) is mounted on the enclosure cover and is electrically coupled, using the various electrical wires 109, to each of the GFCI breakers 110 disposed in the cavity 107 of the enclosure 190.

As a result, a tremendous amount of time and expense is allocated to installing the testing system currently used in the art. As FIG. 1 shows, a large number of electrical wires 109 are disposed in the cavity 107 and terminated at various locations throughout the enclosure 190. It takes a user (e.g., an electrician) hours to perform this wiring, and the chances of crossing wires and having to rewire are high. Also, each switch is highly specialized and relatively expensive. At least one switch is a selector switch used to select a particular GFCI breaker, and so must have at least as many positions as there are GFCI breakers 110 in the cavity 107. The common switch for this purpose has 21 selection positions.

The other switch currently used in the art is a multi-position switch that is used to select one or more particular GFCI breakers 110. Another problem with the switch/pushbutton combination currently used in the art is that multiple (at least two) penetrations must be made through the enclosure cover. If the enclosure 190 is an explosion-proof enclosure, then each penetration has a flame path that must be properly engineered and configured so that the enclosure 190 continues to be compliant with applicable industry safety standards. Again, this adds cost and time to ensuring that the switch/pushbutton combination for testing the GFCI breakers is properly integrated into the enclosure 100. Alternatively (and most commonly), a mechanical plunger can penetrate the enclosure for each GFCI circuit. To test, each mechanical plunger is depressed and mechanically contacts/depress the test button built into the GFCI breaker. This is also cost prohibitive and can, for certain enclosures (e.g., explosion-proof enclosures) create a large number of penetrations (e.g., flame paths) in the enclosure and the mechanical mechanisms that may contain flame paths.

Figure 2:
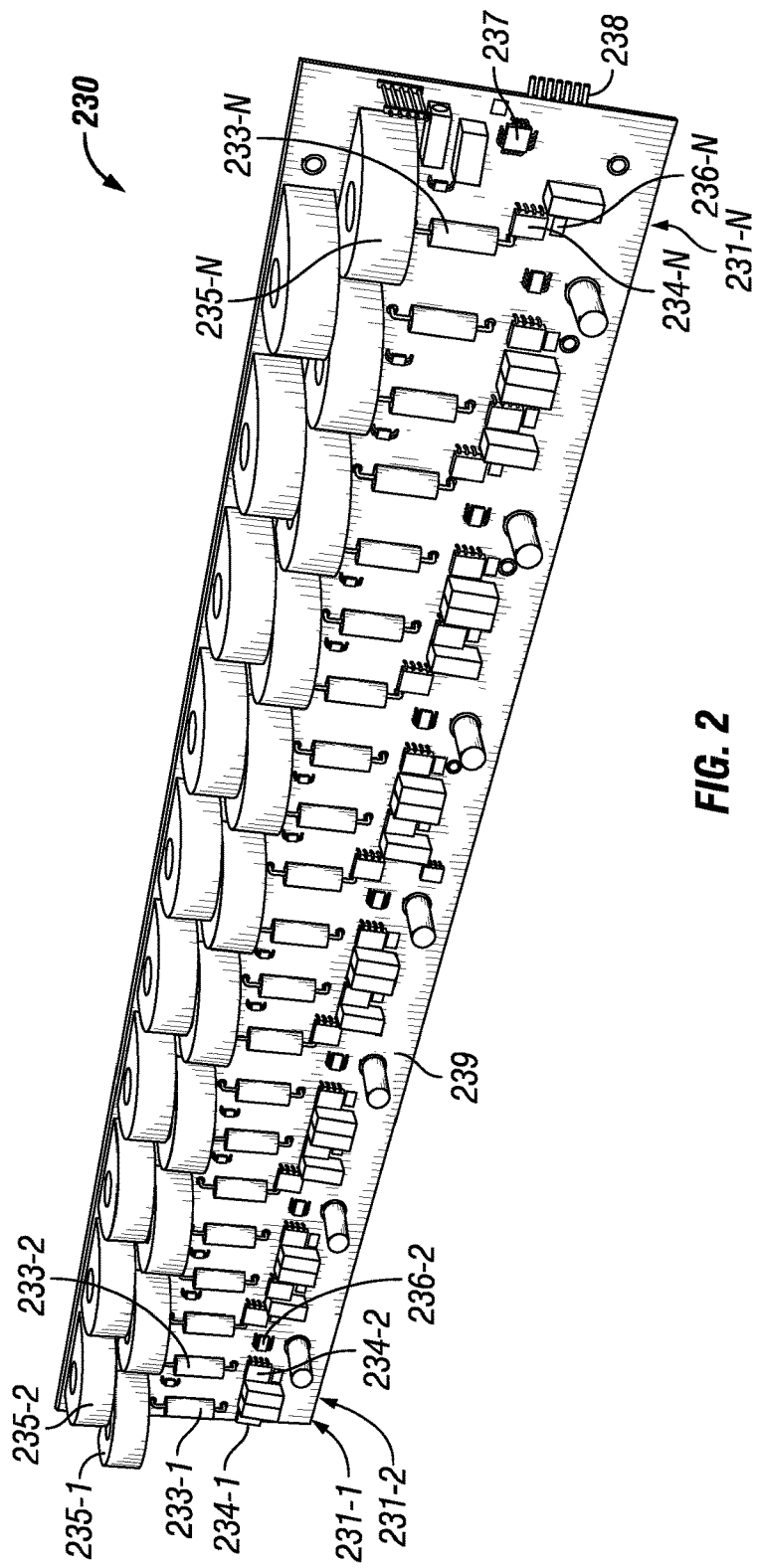
FIG. 2 shows a sensing circuit assembly used in conjunction with multiple GFCI breakers in an enclosure in accordance with certain example embodiments.

By contrast, example embodiments include a user interface assembly and a sensing circuit assembly, each of which are described below, that work in conjunction with each other. Example embodiments have no more than one penetration through the enclosure cover, and the amount of wiring and mechanical parts is substantially reduced compared to the switch/pushbutton combination currently used in the art. Further, example embodiments have significantly fewer (if any) mechanical mechanisms that contain flame paths. FIG. 2 shows a sensing circuit assembly 230 in accordance with certain example embodiments. Referring to FIGS. 1 and 2, the sensing circuit assembly 230 can perform one or more functions. For example, the sensing circuit assembly 230 can have infrared (IR) capability. In such a case, the sensing circuit assembly 230 can detect "hotspots", which are an indication of one or more potentially adverse electrical conditions, including but not limited to a loose terminal connection, overcurrent, undersizing of an electrical conductor, and failure of an electrical conductor.

As another example, the sensing circuit assembly 230 can create a load-to-Earth ground, which creates a short circuit. In such a case, some number (e.g., 21) of GFCI breakers 110 can be electrically coupled to the sensing circuit assembly 230. Thus, when the sensing circuit assembly 230 creates a load-to-Earth ground, one or more of the GFCI breakers 110 can be tested. The sensing circuit assembly 230 can include one or more of a number of components.

For example, the sensing circuit assembly 230 can include a plug connector 238 to allow the sensing circuit assembly 230 (or portions thereof) to send and receive signals (e.g., power signals, control signals, data signals, communication signals) with another portion (e.g., a network manager, the user interface assembly 340) of a system. As another example, the sensing circuit assembly 230 can include a controller 237. In such a case, the controller 237 can control the various local controllers 234 of the switches 231, all described below. The controller 237 can also assume the responsibility of communicating with other portions of the system, including but not limited to the user interface assembly 340.

In certain example embodiments, the controller 237 can include one or more of a number of components. Examples of such components can include, but are not limited to, a control engine, a communication module, a real-time clock, a power module, an energy measurement module, a storage repository, a hardware processor, a memory, a transceiver, an application interface, and a security module. The controller 237 can correspond to a computer system 718 as described below with regard to FIG. 7. More details of the various components of a controller is discussed below with respect to FIG. 6.

In certain example embodiments, the controller 237 includes a hardware processor. Alternatively, the controller 237 does not include a hardware processor. In such a case, the controller 237 can include, as an example, one or more field programmable gate arrays (FPGA), one or more insulated-gate bipolar transistors (IGBTs), one or more integrated circuits (ICs). Using FPGAs, IGBTs, ICs, and/or other similar devices known in the art allows the controller 237 (or portions thereof) to be programmable and function according to certain logic rules and thresholds without the use of a hardware processor. Alternatively, FPGAs, IGBTs, ICs, and/or similar devices can be used in conjunction with one or more hardware processors.

In addition to directing the various switches 234 to operate (e.g., based on the user's instructions, automatically according to a schedule set forth in software of the controller 237), the controller 237 can perform a number of prognostic, diagnostic, and other analytical functions with respect to the GFCI breakers 110. For example, the controller 237 can measure, store, analyze, and report (e.g., automatically, based on user instruction) various information (e.g., amount of ground fault current required to trip circuit during testing, number of operations of the GFCI breaker 110, age of the GFCI breaker, amount of ground fault current that tripped GFCI breaker outside of a test) over time associated with each GFCI breaker 110.

The controller 237 can use this data, as well as other data measured, stored, and analyzed by other controllers 237 from other systems, to determine a number of factors associated with a particular GFCI breaker 110, including but not limited to the expected lift of the GFCI breaker 110, the current trip point of the GFCI breaker 110, and when to schedule maintenance on the GFCI breaker 110. In some cases, the controller 237 can interact with other systems to perform a number of functions. For example, the controller 237 can order a replacement GFCI breaker 110 when an existing one has failed or is about to fail. As another example, the controller 237 can schedule an electrician to replace or maintain a GFCI breaker 110. As yet another example, the controller 237 can automatically compile and submit compliance reports with appropriate entities (e.g., regulatory bodies) with respect to GFCI breaker testing. In some cases, the controller of the user interface assembly 340, described below, can perform some or all of these functions described for the controller 237 of the sensing circuit assembly 230.

As yet another example, the sensing circuit assembly 230 can include multiple switches 231 (e.g., switch 231-1, switch 231-2, switch 231-N) disposed on a circuit board 239. Each switch 231 can include one or more of a number of components, including but not limited to a local controller 234 (e.g., local controller 234-1, local controller 234-2, local controller 234-N), a resistor 233 (e.g., resistor 233-1, resistor 233-2, resistor 233-N), a current transformer 235 (e.g., current transformer 235-1, current transformer 235-2, current transformer 235-N), and an integrated circuit 236 (e.g., integrated circuit 236-2, integrated circuit 236-N).

In other words, the sensing circuit assembly 230 replaces the physical switching of the switches currently used in the art. Much of the wiring related to the sensing circuit assembly 230 is built into the circuit board 239. As a result, much of the electrical wires 109 are not necessary, which greatly reduces labor, materials, and risk of error compared to systems currently used in the art. Each switch 231 can have a single position or multiple positions. A local controller 234 can include one or more of the components described above with respect to the controller 237. A local controller 234 can correspond to a computer system 718 as described below with regard to FIG. 7. More details of the various components of a local controller is discussed below with respect to FIG. 6.

Figure 3A:
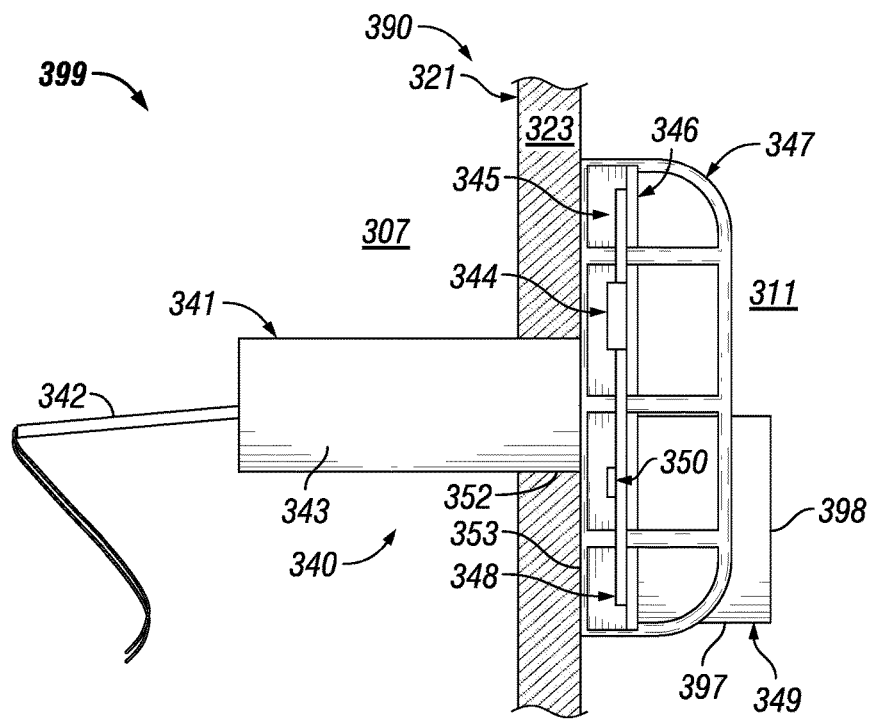
FIGS. 3A and 3B show various views of a user interface assembly in accordance with certain example embodiments.
Figure 3B:
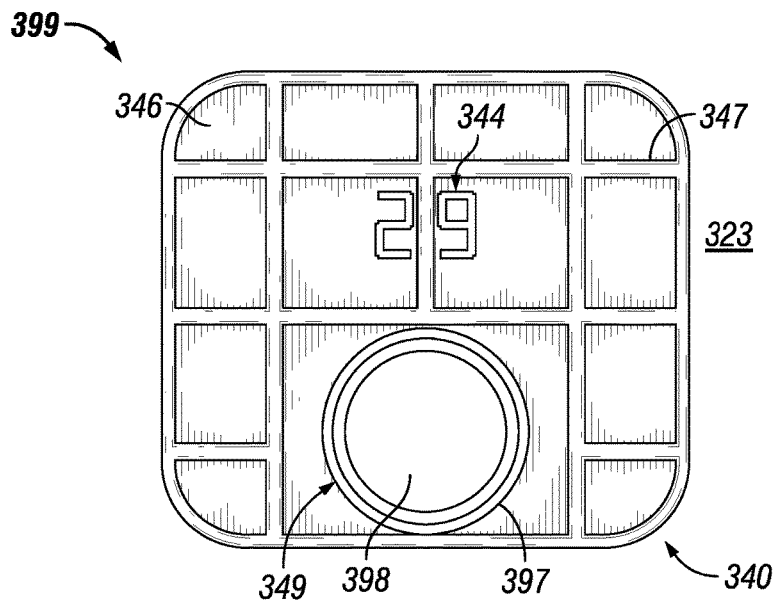

FIGS. 3A and 3B show a cross-sectional side view and a front view, respectively, of a system 399 that includes a user interface assembly 340 in accordance with certain example embodiments. Referring to FIGS. 1-3B, the system 399 of FIGS. 3A and 3B includes the example user interface assembly 340 coupled to a wall 323 of an enclosure cover 321 of an enclosure 390. The user interface assembly 340 can include one or more of a number of features and/or components. For example, as shown in FIG. 3A, the user interface assembly 340 can include a shaft 341, an electrical cable 342, one or more light sources 344, a circuit board assembly 348, a user interface device 349, a cover 346, a controller 350, potting material 345, and a protective device 347.

In certain example embodiments, the shaft 341 can have a wall 343 that forms a cavity, inside of which can be disposed one or more of a number of components. Such components can include, but are not limited to, a portion of the electrical cable 342 and additional potting material 345. The outer surface of the wall 343 can have one or more of a number of coupling features (e.g., mating threads) disposed thereon. If the shaft 341 exists, then the shaft 341 can extend through an aperture (hidden from view in this case by the user interface assembly 340) in the wall 323 of the enclosure cover 321 of the enclosure 390. In such a case, the coupling features disposed on the outer surface of the wall 343 can couple to complementary coupling features disposed on the portion of the wall 323 in the enclosure cover 321 that forms the aperture into which the shaft 341 is disposed. As explained above, the coupling features can be engineered in such a way that allows the enclosure to continue meeting any applicable industry standards (e.g., for explosion-proof enclosures). For example, if the enclosure 390 of FIGS. 3A and 3B is explosion-proof, then a flame path 352 is formed between the shaft 341 of the user interface assembly 340 and the wall 323 of the enclosure 390.

When coupled to an enclosure cover 321, at least a portion of the distal end of the shaft 341 can be disposed in the cavity 307 of the enclosure 390. Similarly, the electrical cable 342 that traverses the shaft 341 is also disposed in the cavity 307 of the enclosure 390. The proximal end of the electrical cable 342 can be electrically coupled to the circuit board assembly 348 of the user interface assembly 340, and the distal end of the electrical cable 342 can be electrically coupled to one or more components (e.g., the sensing circuit assembly 230) within the enclosure 390. In some cases, instead of using an electrical cable 342, communications and/or power flow between the sensing circuit assembly 230 (and/or some other component within the cavity 307 of the enclosure 390) and the user interface assembly 340 can be performed using, at least in part, wireless technology, which can include inductive power transfer.

In certain example embodiments, the one or more light sources 344 illuminate to provide information (e.g., numbers, words) to a user. A light source 344 can assume many types, shapes, and/or forms. For example, as shown in FIG. 3B, each light source 344 can be a seven segment light-emitting diode (LED) display that can display numbers and/or letters. In alternative embodiments, instead of one or more light sources 344, a display panel can be used. Further, if the display panel is interactive (e.g., a touch screen), then the display panel can also be used to replace the user interface device 349. In any case, in addition to displaying information regarding a particular interaction directed by a user, the light source 344 (or other display panel) can display and/or otherwise output other information associated with the prognostic, diagnostic, and/or other analytical functions carried out by the controller of the user interface assembly 340.

The circuit board assembly 348 of the user interface assembly 340 can have components that are substantially similar to the components of the sensing circuit assembly 230 described above with respect to FIG. 2. For example, the circuit board assembly 348 can include a controller 350 (which can have components and perform functions that are substantially similar to the components and functions of the controller 237 described above in FIG. 2), electrical wires, one or more of a number of discrete components (e.g., resistor, capacitor, diode), one or more integrated circuits, and electrical leads. More details of an example controller can be found below with respect to FIG. 6. The controller 350 can correspond to a computer system 718 as described below with regard to FIG. 7. The light sources 344 can be disposed on the outer surface of the circuit board assembly 348 so that they are visible to a user.

Potting material 345 can be used to protect some or all of the circuit board assembly 348. In such a case, the potting material 345 can be disposed between the outer surface of the wall 323 of the enclosure cover 321 and the circuit board assembly 348. In some cases, the potting material 345 can surround some or all of the circuit board assembly 348. In cases where the enclosure 390 is explosion-proof, the potting material 345 can also help establish a flame path that continues between the shaft 341 and the wall 323 of the enclosure 390. Further, as discussed above, in some cases, potting material 345 can be disposed within the cavity formed by the wall 343 of the shaft 341.

The user interface device 349 can be any device (or combination of devices) that allows a user to interact with the user interface assembly 340 by manipulating the user interface device 349. Examples of a user interface device 349 can include, but are not limited to, a dial, a pushbutton, a touchpad, a rotatable guard, a slidebar, a keyboard, and a mouse. In this case, the user interface device 349 is a combination rotary dial 397 and pushbutton 398. In such a case, the rotary dial 397 allows a user to scroll through various options, displayed by the light sources 344, and the pushbutton 398, when depressed, selects an option displayed by the light sources 344.

In certain example embodiments, the user interface device 349 can include one or more components and/or features that eliminate the need for the shaft 341. For example, a wireless communication system can be used between the user interface assembly 340 and the sensing circuit assembly (e.g., sensing circuit assembly 230). As another example, a distal end of the user interface device 349 can include a magnet that can, when placed close enough to the outer surface of the enclosure cover, impose a magnetic field on a magnet and/or magnetic sensor disposed against the inner surface of the enclosure cover. The magnetic field imposed on a magnet and/or magnetic sensor disposed against the inner surface of the enclosure cover can cause a controller of the user interface device 349 to interact with the sensing circuit assembly 230 according to the user's instructions. In such a case, there are no apertures that traverse the enclosure body to accommodate the user interface assembly 340 and its communication with the sensing circuit assembly 230.

Alternatively, a magnet in the user interface device 349 can affect one or more magnetic sensors disposed in the circuit board assembly 348. In such a case, the controller 350 of the circuit board assembly 348 can interact, using the electrical cable 342 that traverses the shaft 341, with the sensing circuit assembly 230 according to the user's instructions. This embodiment can be used, for example, when the cover 346 (discussed below) is disposed over the entire outer surface of the circuit board assembly 348 and/or when the potting compound 345 covers the entire outer surface of the circuit board assembly 348.

In addition to the user interface device 349, or as an alternative to the user interface device 349, the circuit board assembly 348 (described below) can be capable of communicating, using wired and/or wireless technology, with a user device (e.g., a mobile phone, an electronic pad, a handheld computer). In such a case, the user device can be used to provide one or more instructions to the circuit board assembly 348. Regardless of how a user communicates with the user interface assembly 340, the user can instruct the user interface assembly 340 (or, more specifically, the controller 350) to perform any of a number of tests (e.g., all circuits sequentially, all circuits at once, only one circuit) on any of a number of GFCI breakers within the cavity 307 of the enclosure 390 in any of a number of time frames.

The controller 350 of the user interface assembly 340 can also increase the likelihood of compliance with applicable safety standards. For example, the NEC requires that every GFCI breaker is tested no less than every 30 days. In reality, this requirement is very rarely met. In certain example embodiments, the controller 350 of the user interface assembly 340 can be programmed by a user to automatically perform the testing for the GFCI breakers (e.g., GFCI breakers 110) within the cavity 307 of the enclosure 390. Alternatively, the controller 350 can determine an optimal time to test each particular GFCI breaker (e.g., GFCI breaker 110) in the enclosure 390 (for example, based on low power levels flowing through a GFCI breaker during certain times) and perform the tests during times when there is least likely to be a disruption in operations. As stated above, the controller 350 of the user interface assembly 340 can also generate and submit any data required to comply with one or more regulations and/or standards of a regulatory and/or other applicable entity. In turn, this automated compliance reporting using example embodiments could result in one or more of a number of benefits (e.g., reduced insurance premiums for the user, increased reliability).

The cover 346 can be placed over at least a portion (e.g., the parts that are separate from the user interface device 349) of the circuit board assembly 348 to protect one or more of the devices mounted on the outer surface of the circuit board assembly 348. In addition, or in the alternative, the cover 346 can also protect a user from higher voltages (e.g., 120V) that would otherwise be exposed on the outer surface of the circuit board assembly 348. The cover 346 can be made of any of a number of materials (e.g., plastic, metal) and have any of a number of characteristics (e.g., opaque, clear).

In certain example embodiments, the protective device 347 is used to protect one or more other components of the user interface assembly 340 from physical damage caused by one or more objects in the ambient environment 111. The protective device 347 can have any of a number of configurations (e.g., a cage, a mesh, a solid piece) and/or be made of any of a number of suitable materials (e.g., metal, plastic). The protective device 347 can have any of a number of characteristics (e.g., shatter-proof, impact resistant, clear). The protective device 347 can be coupled to another component (e.g., a backing member 353) of the user interface assembly 440 and/or the wall 323 of the enclosure 390 in any one or more of a number of ways. Examples of such coupling methods can include, but are not limited to, ultrasonic welding, epoxy, adhesive, fastening devices (e.g., screws, bolts), clips, tabs, mating threads, snaps, and slots.

Figure 4A:
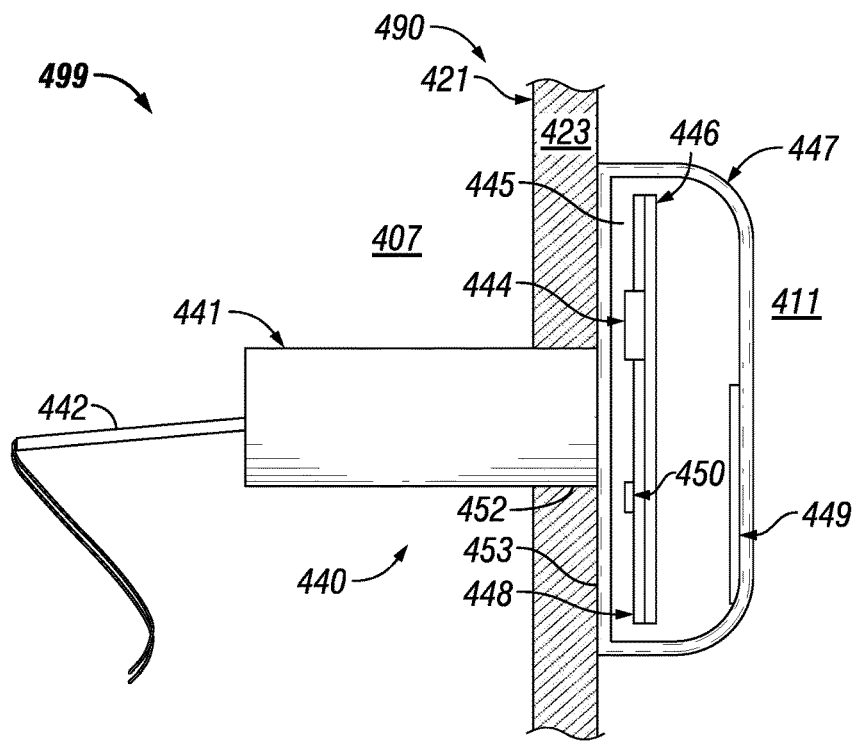
FIGS. 4A and 4B show various views of another user interface assembly in accordance with certain example embodiments.
Figure 4B:
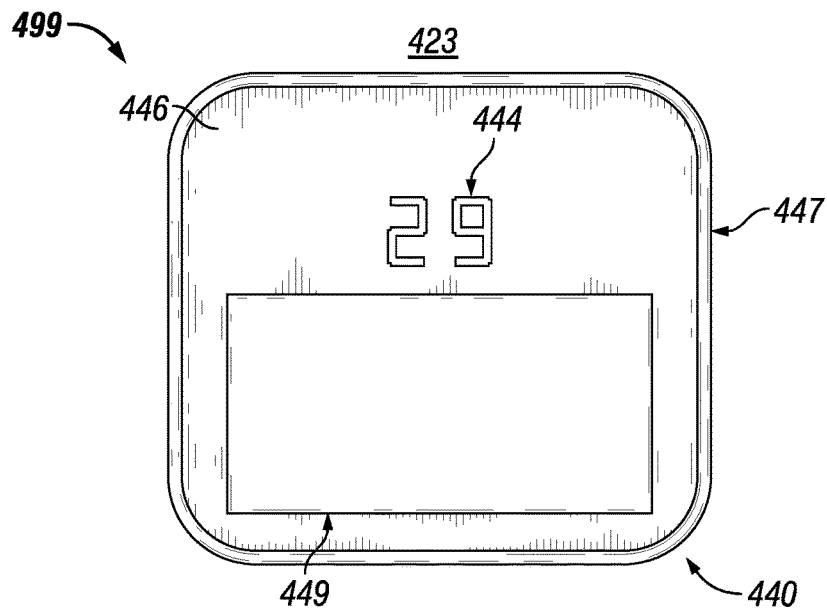

FIGS. 4A and 4B show a cross-sectional side view and a front view, respectively, of a user interface assembly 640 that includes another user interface assembly 440 in accordance with certain example embodiments. The user interface assembly 440 of FIGS. 4A and 4B is substantially similar to the system 399 of FIGS. 3A and 3B, except as described below. For example, referring to FIGS. 1-4B, the system 499 of FIGS. 4A and 4B includes the example user interface assembly 440 coupled to a wall 423 of an enclosure cover 421 of an enclosure 490.

As another example, as shown in FIG. 4A, the user interface assembly 440 can include a shaft 441, an electrical cable 442, one or more light sources 444, a circuit board assembly 448, a user interface device 449, a cover 446, a controller 450, potting material 445, and a protective device 447. In this case, the user interface device 449 of FIGS. 4A and 4B includes a kind of touchscreen. For example, the user interface device 449 of FIGS. 4A and 4B can be a capacitive/strain gauge/Piezoelectric interface. In such a case, the user interface device 449 can be coupled (e.g., affixed, adhered, clipped) to the inner surface of the protective device 447. When the protective device 447 can be seen through (e.g., mesh, clear material), then a user can access (e.g., make direct contact with, make proximate contact with) the user interface device 449, thereby allowing the user to control testing of the GFCI circuit breakers within the cavity 407 of the enclosure 490 using the user interface device 449.

In this case, the protective device 447 is a protective, impact-resistant, and transparent cover. Further, in this case, the protective device 447 is coupled to the backing member 453 using ultra-sonic welding. As with the light sources 344 of FIGS. 3A and 3B, there are two light sources 444 in FIGS. 4A and 4B, where each light source 444 is a seven segment light-emitting diode (LED) display that can display numbers and/or letters. The protective device 447 is disposed in the ambient environment 411, and a portion of the shaft 441 and the electrical cable are disposed within the cavity 407 of the enclosure 490. In certain example embodiments, a light source that includes a LED display can have fewer than or more than seven segments. Further, such a light source can have multiple LED displays rather than a single LED display.

Figure 5:
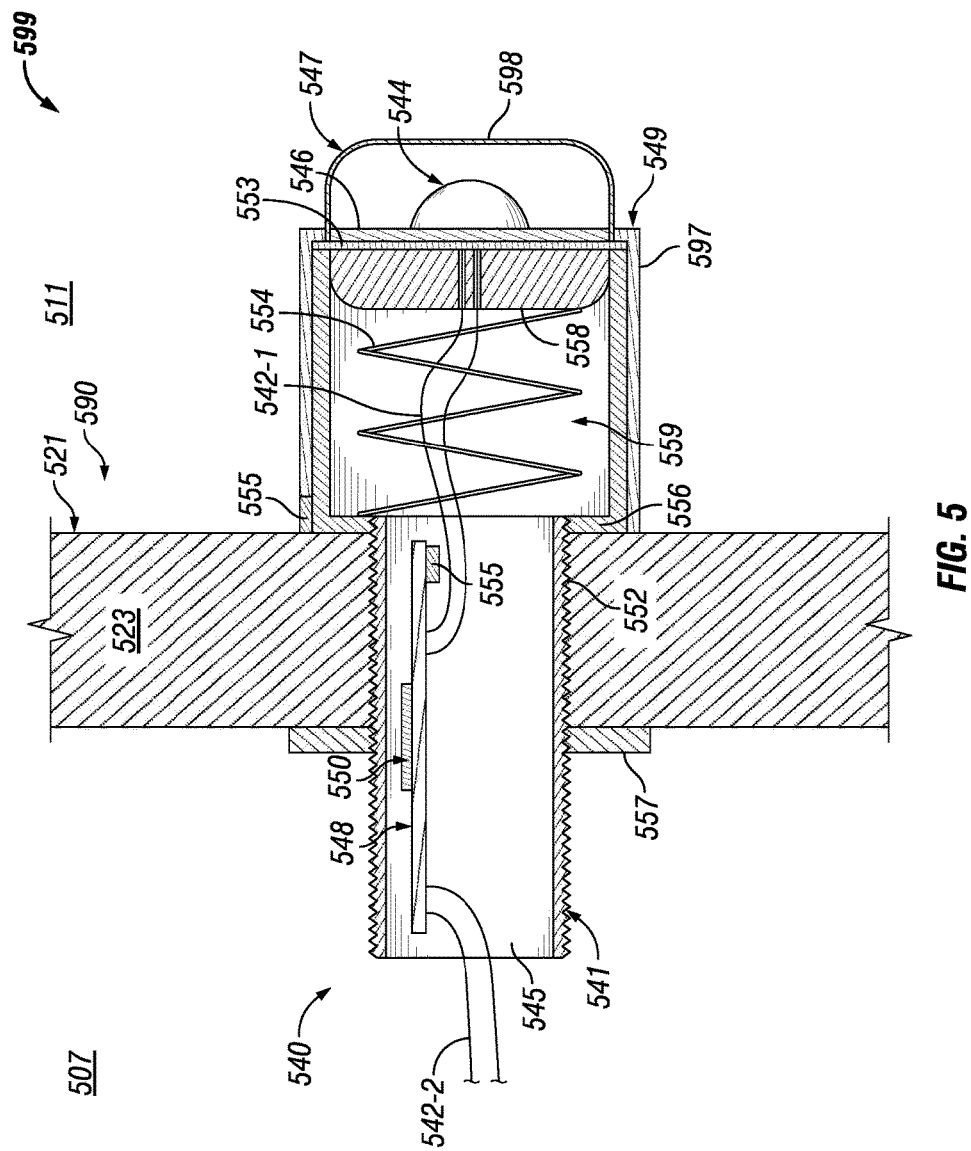
FIG. 5 shows a cross-sectional side view of yet another user interface assembly in accordance with certain example embodiments.

FIG. 5 shows a cross-sectional side view of a system 599 that includes yet another user interface assembly 540 in accordance with certain example embodiments. The system 599 of FIG. 5 is substantially similar to the system 399 of FIGS. 3A and 3B and/or the user interface assembly 440 of FIGS. 4A and 4B, except as described below. For example, referring to FIGS. 1-5, the system 599 of FIG. 5 includes the example user interface assembly 540 coupled to a wall 523 of an enclosure cover 521 of an enclosure 590.

In this case, the user interface assembly 540 of FIG. 5 is configured differently than the user interface assembly 340 of FIGS. 3A and 3B and the user interface assembly 440 of FIGS. 4A and 4B. For example, the circuit board assembly 548 and the controller 550 are disposed within the shaft 541 of the user interface assembly 540. Also, one electrical cable 542-1 provides connectivity between the light sources 544 and the circuit board assembly 548, and another electrical cable 542-2 provides connectivity between the circuit board assembly 548 and a sensing circuit assembly (e.g., sensing circuit assembly 230) within the cavity 507 of the enclosure 590. In this case, there is also potting material 545 inside the shaft 541.

The user interface device 549 of FIG. 5, while consisting of a pushbutton 598 and a rotary dial 597, like the user interface device 349 of FIGS. 3A and 3B, have a different configuration compared to its counterparts in FIGS. 3A and 3B. In this case, the light sources 544, the cover 546, the backing member 553, and the protective device 547 are integrated with the pushbutton 598. In other words, a user applies a force toward the enclosure cover 521 on the protective device 547 to depress the pushbutton 598. The pushbutton 598 can move within a cavity 559 formed by an optional sleeve 556 or the rotary dial 597. There can be some type of resilient device 554 (e.g., a spring) disposed within the cavity 559 so that, when the inward force applied by a user is removed, the pushbutton 598 returns to a normal position from a depressed position.

The optional sleeve 556 can be used to protect the electrical cable 542-1 and provide a bearing surface outside the enclosure 590. Further, the rotary dial 597 in this case is a rotatable guard that surrounds at least part of the pushbutton 598 and the optional sleeve 556 in the ambient environment 511. The rotary dial 597 can be rotated to allow a user to make a selection. As the rotary dial 597 rotates, one or more sensors 555 (e.g., magnetic sensors, proximity sensors) can be used to determine a position of the rotary dial 597 relative to a reference point. Such sensors 555 can be located in any of a number of places on the user interface assembly 540, including but not limited to an inner surface of the rotary dial 597, within the cavity 559, and attached to the circuit board assembly 548.

In addition, to help secure the user interface assembly 540 to the enclosure wall 523 of the enclosure 590, one or more coupling features 557 can be used. Examples of such coupling features 557 can include, but are not limited to, a locking nut (as shown in FIG. 5), a clip, a tab, a detent, a bolt, and a locking pin. In this case, the coupling feature 557 is disposed within the cavity 507 of the enclosure 590. In addition, or in the alternative, one or more coupling features 557 can be disposed in the ambient environment 511. Also in this case, the coupling feature 557 has mating threads that complement the mating threads disposed on the outer surface of the shaft 541, and the coupling feature 557 is rotated toward the light sources 554 until the coupling feature 557 abuts against the inner surface of the wall 523 of the enclosure 590.

In addition to, or in the alternative of the potting material 545, one or more portions of the user interface assembly 540 can be hermetically sealed 558. For example, in this case, the grouping of components that include the light sources 544, the cover 546, the backing member 553, and the protective device 547 are hermetically sealed 588, thereby separating these components from the rest of the pushbutton 598.

Figure 6:
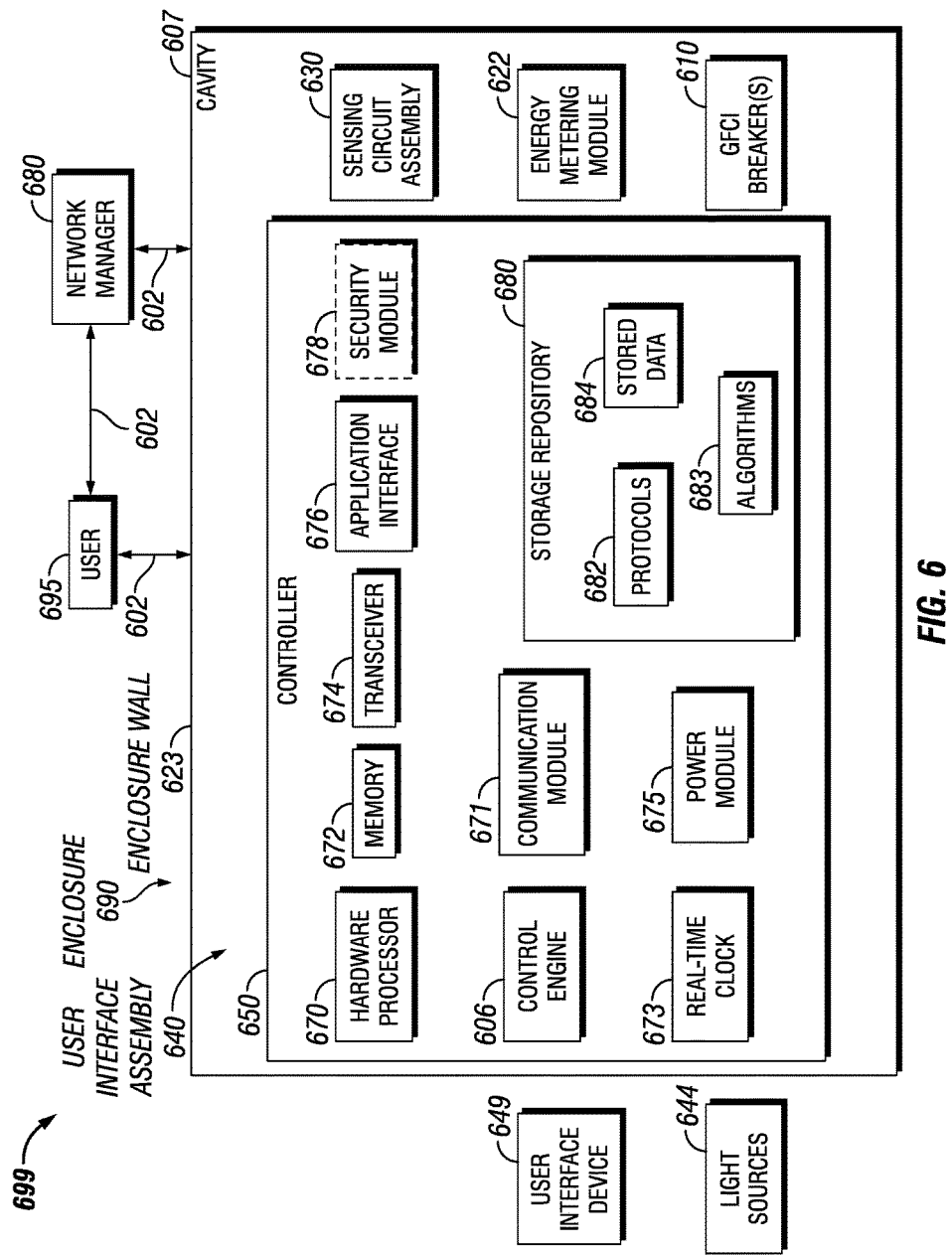
FIG. 6 shows a diagram for a system that includes a user interface assembly in accordance with certain example embodiments.

FIG. 6 shows a diagram for a system 699 that includes a user interface assembly 640 in accordance with certain example embodiments. The system 699 can include a user 695, a network manager 680, and at least one enclosure (e.g., enclosure 690). In addition to the user interface assembly 640, the enclosure 690 can include one or more GFCI breakers 610, one or more sensing circuit assemblies 630, and an energy metering module 622.

The user interface assembly 640 can include one or more of a number of components. Such components, can include, but are not limited to, a controller 650, a user interface device 649, and one or more light sources 644. The controller 650 of the user interface assembly 640 can also include one or more of a number of components. Such components, can include, but are not limited to, a control engine 606, a communication module 671, a real-time clock 673, a power module 675, a storage repository 680, a hardware processor 670, a memory 672, a transceiver 674, an application interface 676, and, optionally, a security module 678. The components shown in FIG. 6 are not exhaustive, and in some embodiments, one or more of the components shown in FIG. 6 may not be included in an example enclosure or other area in which one or more GFCI breakers 610 can be disposed. Any component of the example system 699 can be discrete or combined with one or more other components of the system 699.

Referring to FIGS. 1-6, the user 695 is the same as a user defined above. The user 695 can use a user system (not shown), which may include a display (e.g., a GUI). The user 695 interacts with (e.g., sends data to, receives data from) the controller 650 of the user interface assembly 640 via the application interface 676 (described below). The user 695 can also interact with a network manager 680. Interaction between the user 695 and the user interface assembly 640 and/or the network manager 680 can occur using communication links 602. In certain example embodiments, the user interface device 649 and the user 695 are considered the same entity.

Each communication link 602 can include wired (e.g., Class 1 electrical cables, Class 2 electrical cables, electrical connectors, power line carrier, RS485) and/or wireless (e.g., Wi-Fi, visible light communication, cellular networking, Bluetooth, WirelessHART, ISA100) technology. For example, a communication link 602 can be (or include) one or more electrical conductors (e.g., electrical cable 442) that are coupled to one or more components within the cavity 607 of the enclosure 690. A communication link 602 can transmit signals (e.g., power signals, communication signals, control signals, data) between the user interface assembly 640 and the user 695 and/or the network manager 680. One or more communication links 602 can also be used to transmit signals between components of the user interface assembly 640. A communication link 602 can include an electrical cable (e.g., electrical cable 302) described above.

The network manager 680 is a device or component that controls all or a portion of a communication network that includes the controller 650 of the user interface assembly 640, additional enclosures, and the user 695 that are communicably coupled to the controller 650. The network manager 680 can be substantially similar to the controller 650. Alternatively, the network manager 680 can include one or more of a number of features in addition to, or altered from, the features of the controller 650 described below. As described herein, communication with the network manager 680 can include communicating with one or more other components (e.g., another enclosure) of the system 699. In such a case, the network manager 680 can facilitate such communication.

The one or more sensing circuit assemblies 630 of FIG. 6 can be substantially the same as the sensing circuit assembly 230 described above. Similarly, the GFCI breakers 610 of FIG. 6 can be substantially the same as the GFCI breakers discussed above. The energy metering module 622 measures one or more components (parameters) of energy (e.g., current, voltage, resistance, VARs, watts) associated with the GFCI breakers 610. The energy metering module 622 can also measure one or more parameters associated with power generated and distributed by the power module 675. The energy metering module 622 can include any of a number of measuring devices and related devices, including but not limited to a voltmeter, an ammeter, a power meter, an ohmmeter, a current transformer, a resistor, a potential transformer, and electrical wiring.

The energy metering module 622 can measure a component of energy continuously, periodically, based on the occurrence of an event, based on a command received from the control engine 606, based on measurements captured by the sensing circuit assembly 630, and/or based on some other factor. Such parameters can be measured at, or in close proximity to, at least a portion of a GFCI breaker 610. Further, such parameters can be measured by the sensing circuit assembly 630 and/or the energy metering module 622 while a GFCI breaker 610 is in service. The energy metering module 622 can be part of the sensing circuit assembly 630, part of the controller 650, and/or an independent module within the system 699.

The user 695 and/or the network manager 680 can interact with the controller 650 of the user interface assembly 640 using the application interface 676 in accordance with one or more example embodiments. Specifically, the application interface 676 of the controller 650 receives data (e.g., information, communications, instructions, updates to firmware) from and sends data (e.g., information, communications, instructions) to the user 695 and/or the network manager 680. The user 695 and/or the network manager 680 can include an interface to receive data from and send data to the controller 650 in certain example embodiments. Examples of such an interface can include, but are not limited to, a graphical user interface, a touchscreen, an application programming interface, a keyboard, a monitor, a mouse, a web service, a data protocol adapter, some other hardware and/or software, or any suitable combination thereof.

The controller 650, the user 695, and/or the network manager 680 can use their own system or share a system in certain example embodiments. Such a system can be, or contain a form of, an Internet-based or an intranet-based computer system that is capable of communicating with various software. A computer system includes any type of computing device and/or communication device, including but not limited to the controller 650. Examples of such a system can include, but are not limited to, a desktop computer with LAN, WAN, Internet or intranet access, a laptop computer with LAN, WAN, Internet or intranet access, a smart phone, a server, a server farm, an android device (or equivalent), a tablet, smartphones, and a personal digital assistant (PDA). Such a system can correspond to a computer system as described below with regard to FIG. 7.

Further, as discussed above, such a system can have corresponding software (e.g., user software, sensor software, controller software, network manager software). The software can execute on the same or a separate device (e.g., a server, mainframe, desktop personal computer (PC), laptop, PDA, television, cable box, satellite box, kiosk, telephone, mobile phone, or other computing devices) and can be coupled by the communication network (e.g., Internet, Intranet, Extranet, Local Area Network (LAN), Wide Area Network (WAN), or other network communication methods) and/or communication channels, with wire and/or wireless segments according to some example embodiments. The software of one system can be a part of, or operate separately but in conjunction with, the software of another system within the system 699.

The enclosure 690 can include an enclosure wall 623. The enclosure wall 623 can include at least one wall that forms a cavity 607. In some cases, the enclosure wall 623 (which can include a corresponding enclosure cover) can be designed to comply with any applicable standards so that the enclosure 690 can be located in a particular environment (e.g., a hazardous environment). For example, if the enclosure 690 is located in an explosive environment, the enclosure wall 623 can be explosion-proof. According to applicable industry standards, an explosion-proof enclosure is an enclosure that is configured to contain an explosion that originates inside, or can propagate through, the enclosure.

Continuing with this example, the explosion-proof enclosure is configured to allow gases from inside the enclosure to escape across joints of the enclosure and cool as the gases exit the explosion-proof enclosure. The joints are also known as flame paths (e.g., flame path 452) and exist where two surfaces meet and provide a path, from inside the explosion-proof enclosure to outside the explosion-proof enclosure, along which one or more gases may travel. A joint may be a mating of any two or more surfaces. Each surface may be any type of surface, including but not limited to a flat surface, a threaded surface, and a serrated surface. In the examples shown above with respect to FIGS. 3A-4B, mating threads are disposed on the outer surface of the shaft (e.g., shaft 341) of the user interface assembly 640.

The enclosure wall 623 of the enclosure 690 can be used to house one or more components of the user interface assembly 640, including one or more components of the controller 650. For example, as shown in FIG. 6, the controller 650 (which in this case includes the control engine 606, the communication module 671, the real-time clock 673, the power module 675, the storage repository 680, the hardware processor 670, the memory 672, the transceiver 674, the application interface 676, and the optional security module 678), the GFCI breakers 610, the sensing circuit assembly 630, and the energy metering module 622 are disposed in the cavity 607 formed by the enclosure wall 623. Further, the user interface device 649 and the light sources 644 are located outside the enclosure 690 in the ambient environment. In alternative embodiments, any one or more of these or other components of the user interface assembly 640 can be disposed on the enclosure wall 623 and/or remotely from the enclosure wall 623.

The storage repository 680 can be a persistent storage device (or set of devices) that stores software and data used to assist the controller 650 in communicating with the user 695 and the network manager 680 within the system 699 (and, in some cases, with other systems). In one or more example embodiments, the storage repository 680 stores one or more protocols 682, algorithms 683, and stored data 684. The protocols 682 can be any of a number of protocols that are used to send and/or receive data between the controller 650 and the user 695 and the network manager 680. One or more of the protocols 682 can be a time-synchronized protocol. Examples of such time-synchronized protocols can include, but are not limited to, a highway addressable remote transducer (HART) protocol, a wirelessHART protocol, and an International Society of Automation (ISA) 100 protocol. In this way, one or more of the protocols 682 can provide a layer of security to the data transferred within the system 699.

Protocols 682 can also dictate how and when certain methods are performed. In other words, a protocol 682 can define a process or procedure relative to testing one or more of the GFCI breakers 610. The algorithms 683 can be any formulas, logic steps, mathematical models, and/or other similar functions that the control engine 606 of the controller 650 follows (e.g., based on a protocol 682). An example of an algorithm 683 is measuring (using, for example, the energy metering module 622 and the sensing circuit assembly 630) various parameters associated with the GFCI breakers 610, storing (using the stored data 684 in the storage repository 680), and/or evaluating the current and voltage delivered to and delivered by the sensing circuit assembly 630 over time (as measured by the real-time clock 673).

Algorithms 683 can be focused on the GFCI breakers 610. For example, there can be one or more algorithms 683 that focus on the expected useful life of a GFCI breaker 610. Another example of an algorithm 683 is comparing and correlating data collected with a particular GFCI breaker 610 with corresponding data from one or more other GFCI breakers 610. Any algorithm 683 can be altered (for example, using machine-learning techniques such as alpha-beta) over time by the control engine 606 based on actual performance data so that the algorithm 683 can provide more accurate results over time. As another example, an algorithm 683 can determine when one or more GFCI breakers 610 of the enclosure 690 are beginning to fail. In such a case, a protocol 682 can direct the control engine 606 to generate an alarm for predictive maintenance. If data from other GFCI breakers 610 is used in an algorithm 683 to predict the performance of a particular GFCI breaker 610, then the control engine 606 can determine which other circuit breakers 610 (using, for example, particular data) are used.

As another example, a protocol 682 can use an algorithm 683 to continuously monitor the current (as measured by the energy metering module 622 and stored as stored data 684) that flows through the line-side terminals and the load-side terminals of a GFCI breaker 610. The algorithm 683 can detect variations of the current flowing through the GFCI breaker 610 and predict failure of the GFCI breaker 610 (including a specific portion thereof).

Yet another example algorithm 683 can be to measure and analyze the magnitude and number of surges (ringing waves) that a GFCI breaker 610 is subjected to over time. The algorithm 683 can predict the expected useful life of the GFCI breaker 610 based on a threshold value. Still another example algorithm 683 can be to measure and analyze the efficiency of a GFCI breaker 610 over time. An alarm can be generated by the control engine 606 when the efficiency of the GFCI breaker 610 falls below a threshold value, indicating failure of the GFCI breaker 610.

An algorithm 683 can use any of a number of mathematical formulas, models, and/or algorithms. For example, an algorithm 683 can use linear or polynomial regression. In some cases, an algorithm 683 can be adjusted based on a parameter measured by a sensing circuit assembly 630 and/or the energy metering module 622. For example, an algorithm 683 that includes a polynomial regression can be adjusted based on ambient air temperature measured by a sensing circuit assembly 630. As described below, an algorithm 683 can be used in correlation analysis. In such a case, an algorithm can use any of a number of correlation and related (e.g., closeness-to-fit) models, including but not limited to Chi-squared and Kolmogorov-Smirnov.

For example, an algorithm 683 can develop a stress versus life relationship using accelerated life testing for the GFCI breaker 610 or a component thereof. One instance would be an actual lifetime temperature of the line-side terminals (e.g., line-side terminals 253) versus a modeled or estimated temperature profile of the line-side terminals, where the profile can be based, at least in part, on stored data 684 measured for other circuit breakers. As another example, an algorithm 683 can measure and analyze real-time application stress conditions of the GFCI breaker 610 or components thereof over time and use developed models to estimate the life of the GFCI breaker 610 or components thereof. In such a case, mathematical models can be developed using one or more mathematical theories (e.g., Arrhenius theory, Palmgran-Miner Rules) to predict useful life of the GFCI breaker 610 or components thereof under real stress conditions. As yet another example, an algorithm 683 can use predicted values and actual data to estimate the remaining life of the GFCI breaker 610 or components thereof.

Stored data 684 can be any data (e.g., nameplate, historical performance, manufacturer's curves) associated with the GFCI breaker 610 (including other circuit breakers and/or any components thereof), any measurements taken by the sensing circuit assembly 630, measurements taken by the energy metering module 622, threshold values, results of previously run or calculated algorithms, and/or any other suitable data. Such data can be any type of data, including but not limited to historical data for the GFCI breaker 610, historical data for other GFCI breakers, calculations, measurements taken by the sensing circuit assembly 630, and measurements taken by the energy metering module 622. The stored data 684 can be associated with some measurement of time derived, for example, from the real-time clock 673.

Examples of a storage repository 680 can include, but are not limited to, a database (or a number of databases), a file system, a hard drive, flash memory, some other form of solid state data storage, or any suitable combination thereof. The storage repository 680 can be located on multiple physical machines, each storing all or a portion of the protocols 682, the algorithms 683, and/or the stored data 684 according to some example embodiments. Each storage unit or device can be physically located in the same or in a different geographic location.

The storage repository 680 can be operatively connected to the control engine 606. In one or more example embodiments, the control engine 606 includes functionality to communicate with the user 695 and the network manager 680 in the system 699. More specifically, the control engine 606 sends information to and/or receives information from the storage repository 680 in order to communicate with the user 695 and the network manager 680. As discussed below, the storage repository 680 can also be operatively connected to the communication module 671 in certain example embodiments.

In certain example embodiments, the control engine 606 of the controller 650 controls the operation of one or more components (e.g., the communication module 671, the real-time clock 673, the transceiver 674) of the controller 650. For example, the control engine 606 can activate the communication module 671 when the communication module 671 is in "sleep" mode and when the communication module 671 is needed to send data received from another component (e.g., the user 695, the network manager 680) in the system 699.

As another example, the control engine 606 can acquire the current time using the real-time clock 673. The real-time clock 673 can enable the controller 650 to monitor the GFCI breaker 610 even when the controller 650 has no communication with the network manager 680. As yet another example, the control engine 606 can direct the energy metering module 622 to measure and send power consumption information of the GFCI breaker 610 to the network manager 680.

The control engine 606 can be configured to perform a number of functions that help prognosticate and monitor the health of the GFCI breaker 610 (or components thereof), either continually or on a periodic basis. For example, the control engine 606 can execute any of the algorithms 683 stored in the storage repository 680 using one or more protocols 682. As a specific example, using one or more protocols 682, the control engine 606 can measure (using the energy metering module 622), store (as stored data 684 in the storage repository 680), and evaluate, using an algorithm 683, the current and voltage delivered to and delivered by a GFCI breaker 610 over time. As yet another example, the control engine 606 can track the amount of time it takes for a GFCI breaker 610 to close and the level of current that caused the GFCI breaker 610 to trip.

As another specific example, the control engine 606 can use one or more algorithms 683 that focus on certain components of the GFCI breaker 610. For example, the control engine 606 can use one or more algorithms 683 that focus on the integrity of the trip mechanism of the GFCI breaker 610. The control engine 606 can also monitor moisture levels (as measured by the sensing circuit assembly 630 and stored as stored data 684) within the cavity 607 of the enclosure 690 over time and notify the user 695 that moisture levels within the enclosure 690 exceed a threshold value (as stored as stored data 684). The control engine 606 can also determine, using data collected by the sensing circuit assembly 630 and/or the energy metering module 622, whether the high moisture levels have caused corrosion in portions of the GFCI breaker 610.

The control engine 606 can analyze and detect short-term problems that can arise with a GFCI breaker 610. For example, the control engine 606 can compare new data (as measured by a sensing circuit assembly 630 and/or the energy metering module 622) to a reference curve (part of the stored data 684) for that particular GFCI breaker 610 or for a number of GFCI breakers 610 of the same type (e.g., manufacturer, model number, current rating). The control engine 606 can determine whether the current data fits the curve, and if not, the control engine 606 can determine how severe a problem with the circuit breaker might be based on the extent of the lack of fit.

The control engine 606 can also analyze and detect long-term problems that can arise with a GFCI breaker 610. For example, the control engine 606 can compare new data (as measured by a sensing circuit assembly 630 and/or the energy metering module 622) to historical data (part of the stored data 684) for that particular GFCI breaker 610 and/or for a number of GFCI breakers 610 of the same type (e.g., manufacturer, model number, current rating). In such a case, the control engine 606 can make adjustments to one or more of the curves based, in part, on actual performance and/or data collected while testing one or more of the GFCI breakers 610 while those GFCI breakers 610 are out of service.

The control engine 606 can also collect data, using the network manager 680, of one or more circuit breakers outside the enclosure 690, store the data as stored data 684, and compare this data with corresponding data (as collected by the sensing circuit assembly 630 and the energy metering module 622 and stored as stored data 684) of the GFCI breakers 610 within the enclosure 690 to see if a correlation can be developed. The control engine 606 can analyze each of the GFCI breakers 610 while those GFCI breakers 610 are in service and/or out of service.

Real-time stress information collected in the enclosure 690 by the sensing circuit assembly 630 and the energy metering module 622 can be used by the control engine 606, along with stress-life models stored in storage repository 680, to predict the useful life of the GFCI breaker 610 and/or components thereof. As another example, the control engine 606 can determine whether one or more GFCI breakers 610 within the enclosure 690 are failing and generate an alarm for predictive maintenance, schedule the required maintenance, reserve replacement parts in an inventory management system, order replacement parts, and/or perform any other functions that actively repair or replace the failing GFCI breaker 610.

As another example, the control engine 606 can continuously monitor the current (as measured by the energy metering module 622 and stored as stored data 684) output by the load-side terminals of the GFCI breaker 610. By combining the current and temperature information, the control engine 606 can use one or more algorithms 683 to infer the resistance of the GFCI breaker 610. One such algorithm 683 can be a model of a temperature versus current curve for the GFCI breaker 610. The resulting temperature versus current curve can be based on a specification sheet for a GFCI breaker 610. In addition, or in the alternative, the resulting temperature versus current curve can be generated and updated automatically based on the performance over time of a new GFCI breaker 610.

As still another example, the control engine 606 can monitor a temperature (using the sensing circuit assembly 630) of acritical component (e.g., the trip mechanism) of the GFCI breaker 610 over time. The control engine 606 can estimate the remaining life of the component of the GFCI breaker 610 based on degradation curves of those components and threshold values established for those components.

The control engine 606 can also measure and record the number of operations of the trip mechanism of a GFCI breaker 610 over time. A trip operation can be stored as stored data 684 in the storage repository 680. Each occurrence of a trip operation can be recorded as a voluntary event (e.g., the trip mechanism is operated by a user 695) or an involuntary event (e.g., the trip mechanism is operated because of a ground fault). The control engine 606 can further measure (using the energy metering module 622) and analyze the magnitude and number of surges that the GFCI breaker 610 is subjected to over time. Using an algorithm 683, the control engine 606 can predict, using stored data 443 for the GFCI breaker 610 and other circuit breakers, the expected useful life of the GFCI breaker 610 based on a threshold value.

The control engine 606 can provide control, communication, and/or other similar signals to the user 695, the network manager 680, the user interface device 649, the light sources 644, the sensing circuit assembly 630, and the energy metering module 622. Similarly, the control engine 606 can receive control, communication, and/or other similar signals from the user 695, the network manager 680, the user interface device 649, the light sources 644, the sensing circuit assembly 630, and the energy metering module 622. The control engine 606 can control each of the sensing circuit assembly 630 and the energy metering module 622 automatically (for example, based on one or more algorithms 683) and/or based on control, communication, and/or other similar signals received from another device through a communication link 602. As an example, when a sensing circuit assembly 630 includes an infrared sensor, the control engine 606 can direct the infrared sensor to move so that multiple components (or portions thereof) can be measured by the infrared sensor. The control engine 606 may include or be disposed on a printed circuit board (e.g., circuit board assembly 348), upon which the hardware processor 670 and/or one or more discrete components of the controller 650 are positioned.

In certain embodiments, the control engine 606 of the controller 650 can communicate with one or more components of a system external to the system 699 in furtherance of prognostications and evaluations of the GFCI breakers 610 within the enclosure 690. For example, the control engine 606 can interact with an inventory management system by ordering a GFCI breaker (or one or more components thereof) to replace the GFCI breaker 610 (or one or more components thereof) that the control engine 606 has determined to fail or be failing. As another example, the control engine 606 can interact with a workforce scheduling system by scheduling a maintenance crew to repair or replace the GFCI breaker 610 (or portion thereof) when the control engine 606 determines that the GFCI breaker 610 or portion thereof requires maintenance or replacement. In this way, the controller 650 is capable of performing a number of functions beyond what could reasonably be considered a routine task.

In certain example embodiments, the control engine 606 can include an interface that enables the control engine 606 to communicate with one or more components (e.g., sensing circuit assembly 630) of the system 699. For example, if the sensing circuit assembly 630 of the GFCI breaker 610 operates under IEC Standard 62386, then the sensing circuit assembly 630 can have a serial communication interface that will transfer data (e.g., stored data 684) measured by the sensing circuit assembly 630. In such a case, the control engine 606 can also include a serial interface to enable communication with the sensing circuit assembly 630. Such an interface can operate in conjunction with, or independently of, the protocols 682 used to communicate between the controller 650 and the user 695 and/or the network manager 680.

The control engine 606 (or other components of the controller 650) can also include one or more hardware components and/or software elements to perform its functions. Such components can include, but are not limited to, a universal asynchronous receiver/transmitter (UART), a serial peripheral interface (SPI), a direct-attached capacity (DAC) storage device, an analog-to-digital converter, an inter-integrated circuit ($I^2C$), and a pulse width modulator (PWM).

The communication module 671 of the controller 650 determines and implements the communication protocol (e.g., from the protocols 682 of the storage repository 680) that is used when the control engine 606 communicates with (e.g., sends signals to, receives signals from) the user 695, the network manager 680, the user interface device 649, the light sources 644, the sensing circuit assembly 630, and/or the energy metering module 622. In some cases, the communication module 671 accesses the stored data 684 to determine which communication protocol is used to communicate with a component of the system 699 associated with the stored data 684. In addition, the communication module 671 can interpret the protocol 682 of a communication received by the controller 650 so that the control engine 606 can interpret the communication.

The communication module 671 can send and receive data between the network manager 680, the user interface device 649, the light sources 644, the users 695 and the controller 650. The communication module 671 can send and/or receive data in a given format that follows a particular protocol 682. The control engine 606 can interpret the data packet received from the communication module 671 using the protocol 682 information stored in the storage repository 680. The control engine 606 can also facilitate the data transfer between components of the system 699 by converting the data into a format understood by those components.

The communication module 671 can send data (e.g., protocols 682, algorithms 683, stored data 684, operational information, alarms) directly to and/or retrieve data directly from the storage repository 680. Alternatively, the control engine 606 can facilitate the transfer of data between the communication module 671 and the storage repository 680. The communication module 671 can also provide encryption to data that is sent by the controller 650 and decryption to data that is received by the controller 650. The communication module 671 can also provide one or more of a number of other services with respect to data sent from and received by one or more components of the system 699. Such services can include, but are not limited to, data packet routing information and procedures to follow in the event of data interruption.

The real-time clock 673 of the controller 650 can track clock time, intervals of time, an amount of time, and/or any other measure of time. The real-time clock 673 can also count the number of occurrences of an event, whether with or without respect to time. Alternatively, the control engine 606 can perform the counting function. The real-time clock 673 is able to track multiple time measurements concurrently. The real-time clock 673 can track time periods based on an instruction received from the control engine 606, based on an instruction received from the user 695, based on an instruction programmed in the software for the controller 650, based on some other condition or from some other component, or from any combination thereof.

The real-time clock 673 can be configured to track time when there is no power delivered to the controller 650 using, for example, a super capacitor or a battery backup. In such a case, when there is a resumption of power delivery to the controller 650, the real-time clock 673 can communicate any aspect of time to the controller 650. In such a case, the real-time clock 673 can include one or more of a number of components (e.g., a super capacitor, an integrated circuit) to perform these functions.

The power module 675 of the controller 650 provides power to one or more components (e.g., real-time clock 673, control engine 606) of the controller 650. The power module 675 can include one or more of a number of single or multiple discrete components (e.g., transistor, diode, resistor), and/or a microprocessor. The power module 675 may include a printed circuit board, upon which the microprocessor and/or one or more discrete components are positioned. In some cases, the energy metering module 622 can measure one or more elements of power that flows into, out of, and/or within the power module 675 of the controller 650. The power module 675 can receive power from a power source external to the system 699. Such external source of power can also be used to provide power to the GFCI breakers 610.

The power module 675 can include one or more components (e.g., a transformer, a diode bridge, an inverter, a converter) that receives power (for example, through an electrical cable) from a source external to the enclosure 690 and generates power of a type (e.g., alternating current, direct current) and level (e.g., 12V, 24V, 670V) that can be used by the other components of the user interface assembly 640 and/or within the enclosure 690. The power module 675 can use a closed control loop to maintain a preconfigured voltage or current with a tight tolerance at the output. The power module 675 can also protect some or all of the rest of the electronics (e.g., hardware processor 670, transceiver 674) in the enclosure 690 from surges generated in the line.

In addition, or in the alternative, the power module 675 can be a source of power in itself to provide signals to the other components of the controller 650 and/or the sensing circuit assembly 630. For example, the power module 675 can be a battery. As another example, the power module 675 can be a localized photovoltaic power system. The power module 675 can also have sufficient isolation in the associated components of the power module 675 (e.g., transformers, opto-couplers, current and voltage limiting devices) so that the power module 675 is certified to provide power to an intrinsically safe circuit.

In certain example embodiments, the power module 675 of the controller 650 can also provide power and/or control signals, directly or indirectly, to one or more of the sensing circuit assembly 630 and/or one or more of the energy metering module 622. In such a case, the control engine 606 can direct the power generated by the power module 675 to the energy metering module 622 and/or the sensing circuit assembly 630. In this way, power can be conserved by sending power to the energy metering module 622 and/or the sensing circuit assembly 630 when those devices need power, as determined by the control engine 606.

The hardware processor 670 of the controller 650 executes software, algorithms (e.g., algorithms 683), and firmware in accordance with one or more example embodiments. Specifically, the hardware processor 670 can execute software on the control engine 606 or any other portion of the controller 650, as well as software used by the user 695 and the network manager 680. The hardware processor 670 can be an integrated circuit, a central processing unit, a multi-core processing chip, SoC, a multi-chip module including multiple multi-core processing chips, or other hardware processor in one or more example embodiments. The hardware processor 670 can be known by other names, including but not limited to a computer processor, a microprocessor, and a multi-core processor.

In one or more example embodiments, the hardware processor 670 executes software instructions stored in memory 672. The memory 672 includes one or more cache memories, main memory, and/or any other suitable type of memory. The memory 672 can include volatile and/or non-volatile memory. The memory 672 is discretely located within the controller 650 relative to the hardware processor 670 according to some example embodiments. In certain configurations, the memory 672 can be integrated with the hardware processor 670.

In certain example embodiments, the controller 650 does not include a hardware processor 670. In such a case, the controller 650 can include, as an example, one or more FPGAs, one or more IGBTs, and/or one or more ICs. Using FPGAs, IGBTs, ICs, and/or other similar devices known in the art allows the controller 650 (or portions thereof) to be programmable and function according to certain logic rules and thresholds without the use of a hardware processor. Alternatively, FPGAs, IGBTs, ICs, and/or similar devices can be used in conjunction with one or more hardware processors 670.

The transceiver 674 of the controller 650 can send and/or receive control and/or communication signals. Specifically, the transceiver 674 can be used to transfer data between the controller 650 and the user 695 and the network manager 680. The transceiver 674 can use wired and/or wireless technology. The transceiver 674 can be configured in such a way that the control and/or communication signals sent and/or received by the transceiver 674 can be received and/or sent by another transceiver that is part of the user 695 and/or the network manager 680. The transceiver 674 can use any of a number of signal types, including but not limited to radio signals.

When the transceiver 674 uses wireless technology, any type of wireless technology can be used by the transceiver 674 in sending and receiving signals. Such wireless technology can include, but is not limited to, Wi-Fi, visible light communication, cellular networking, and Bluetooth. The transceiver 674 can use one or more of any number of suitable communication protocols (e.g., ISA100, HART) when sending and/or receiving signals. Such communication protocols can be stored in the protocols 682 of the storage repository 680. Further, any transceiver information for the user 695 and/or the network manager 680 can be part of the stored data 684 (or similar areas) of the storage repository 680.

Optionally, in one or more example embodiments, the security module 678 secures interactions between the controller 650, the user 695 and/or the network manager 680. More specifically, the security module 678 authenticates communication from software based on security keys verifying the identity of the source of the communication. For example, user software may be associated with a security key enabling the software of the user 695 to interact with the controller 650. Further, the security module 678 can restrict receipt of information, requests for information, and/or access to information in some example embodiments.

Figure 7:
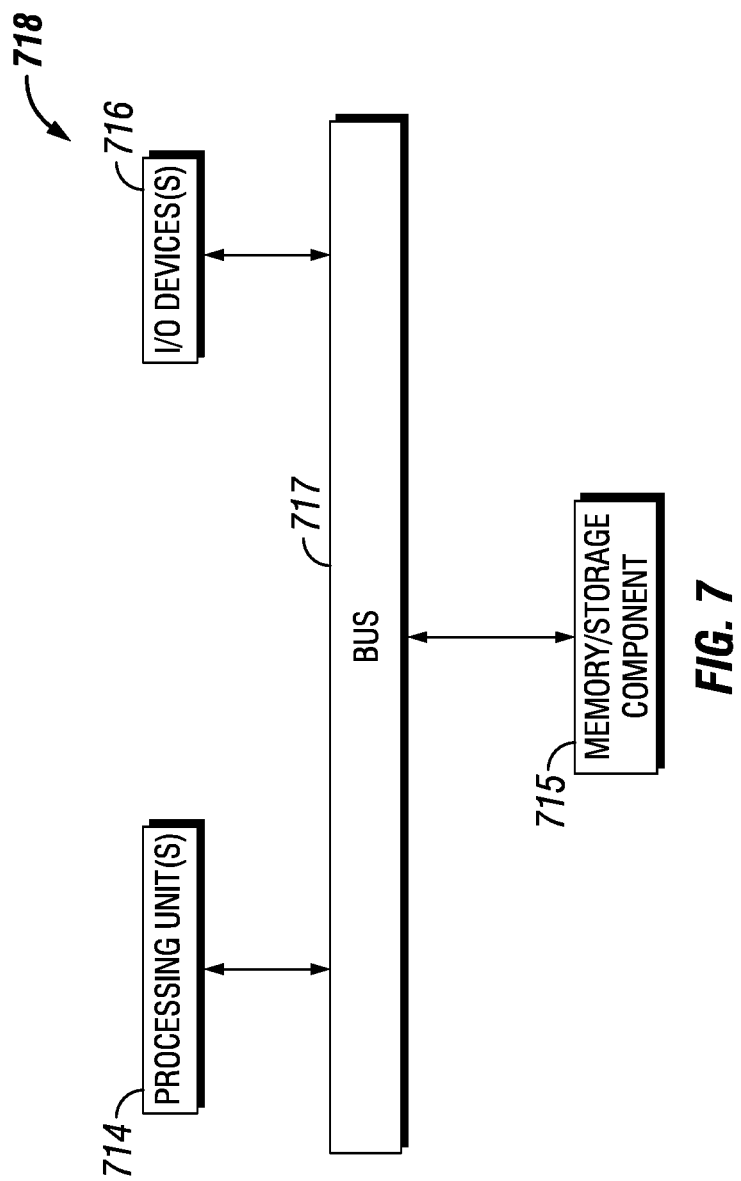
FIG. 7 shows a computing device in accordance with certain example embodiments.

FIG. 7 illustrates one embodiment of a computing device 718 that implements one or more of the various techniques described herein, and which is representative, in whole or in part, of the elements described herein pursuant to certain example embodiments. Computing device 718 is one example of a computing device and is not intended to suggest any limitation as to scope of use or functionality of the computing device and/or its possible architectures. Neither should computing device 718 be interpreted as having any dependency or requirement relating to any one or combination of components illustrated in the example computing device 718.

Computing device 718 includes one or more processors or processing units 714, one or more memory/storage components 715, one or more input/output (I/O) devices 713, and a bus 717 that allows the various components and devices to communicate with one another. Bus 717 represents one or more of any of several types of bus structures, including a memory bus or memory controller, a peripheral bus, an accelerated graphics port, and a processor or local bus using any of a variety of bus architectures. Bus 717 includes wired and/or wireless buses.

Memory/storage component 715 represents one or more computer storage media. Memory/storage component 715 includes volatile media (such as random access memory (RAM)) and/or nonvolatile media (such as read only memory (ROM), flash memory, optical disks, magnetic disks, and so forth). Memory/storage component 715 includes fixed media (e.g., RAM, ROM, a fixed hard drive, etc.) as well as removable media (e.g., a Flash memory drive, a removable hard drive, an optical disk, and so forth).

One or more I/O devices 713 allow a customer, utility, or other user to enter commands and information to computing device 718, and also allow information to be presented to the customer, utility, or other user and/or other components or devices. Examples of input devices include, but are not limited to, a keyboard, a cursor control device (e.g., a mouse), a microphone, a touchscreen, and a scanner. Examples of output devices include, but are not limited to, a display device (e.g., a monitor or projector), speakers, outputs to a lighting network (e.g., DMX card), a printer, and a network card.

Various techniques are described herein in the general context of software or program modules. Generally, software includes routines, programs, objects, components, data structures, and so forth that perform particular tasks or implement particular abstract data types. An implementation of these modules and techniques are stored on or transmitted across some form of computer readable media. Computer readable media is any available non-transitory medium or non-transitory media that is accessible by a computing device. By way of example, and not limitation, computer readable media includes "computer storage media".

"Computer storage media" and "computer readable medium" include volatile and non-volatile, removable and non-removable media implemented in any method or technology for storage of information such as computer readable instructions, data structures, program modules, or other data. Computer storage media include, but are not limited to, computer recordable media such as RAM, ROM, EEPROM, flash memory or other memory technology, CD-ROM, digital versatile disks (DVD) or other optical storage, magnetic cassettes, magnetic tape, magnetic disk storage or other magnetic storage devices, or any other medium which is used to store the desired information and which is accessible by a computer.

The computer device 718 is connected to a network (not shown) (e.g., a local area network (LAN), a wide area network (WAN) such as the Internet, cloud, or any other similar type of network) via a network interface connection (not shown) according to some example embodiments. Those skilled in the art will appreciate that many different types of computer systems exist (e.g., desktop computer, a laptop computer, a personal media device, a mobile device, such as a cell phone or personal digital assistant, or any other computing system capable of executing computer readable instructions), and the aforementioned input and output means take other forms, now known or later developed, in other example embodiments. Generally speaking, the computer system 718 includes at least the minimal processing, input, and/or output means necessary to practice one or more embodiments.

Further, those skilled in the art will appreciate that one or more elements of the aforementioned computer device 718 is located at a remote location and connected to the other elements over a network in certain example embodiments. Further, one or more embodiments is implemented on a distributed system having one or more nodes, where each portion of the implementation (e.g., controller 650 of the user interface assembly 640) is located on a different node within the distributed system. In one or more embodiments, the node corresponds to a computer system. Alternatively, the node corresponds to a processor with associated physical memory in some example embodiments. The node alternatively corresponds to a processor with shared memory and/or resources in some example embodiments.

Example embodiments can provide for measuring and monitoring the performance parameters of GFCI breakers within enclosures. In some cases, the enclosures in which example embodiments are used are located in hazardous (e.g., explosion-proof) environments. As such, example embodiments can be used in environments where one or more applicable industry standards must be met by the enclosure. By tracking the various performance parameters of the GFCI breakers over time, example embodiments can indicate important information such as the useful life of a particular GFCI breaker to a user.

Example embodiments can include a controller that communicates with the switches. In addition, the controller can interactively communicate with a user (e.g., through the user interface, an alarm, an indicating light), a network manager, a maintenance department, an inventory management system, and/or any other entity that can be involved in the dissemination of information regarding the explosion-proof enclosure. Example embodiments have a number of benefits over the present art, including but not limited to reduced materials, simpler installation and maintenance, increased reliability, enhanced user experience, and decreased risk of causing an enclosure to fall out of compliance with applicable industry standards.

Although embodiments described herein are made with reference to example embodiments, it should be appreciated by those skilled in the art that various modifications are well within the scope and spirit of this disclosure. Those skilled in the art will appreciate that the example embodiments described herein are not limited to any specifically discussed application and that the embodiments described herein are illustrative and not restrictive. From the description of the example embodiments, equivalents of the elements shown therein will suggest themselves to those skilled in the art, and ways of constructing other embodiments using the present disclosure will suggest themselves to practitioners of the art. Therefore, the scope of the example embodiments is not limited herein.

What is claimed is:

1. A ground fault circuit interrupter (GFCI) breaker testing system, the system comprising:
    an enclosure comprising at least one wall that forms a cavity;
    at least one GFCI breaker disposed within the cavity, wherein the at least one GFCI breaker comprises a first current measuring device that measures a current flowing through the at least one GFCI breaker, wherein the at least one GFCI breaker opens when the current exceeds a threshold value;
    a sensing circuit assembly comprising at least one switch, a controller, and at least one second current measuring device, wherein the at least one switch is electrically coupled to the at least one GFCI breaker, wherein the at least one second current measuring device is configured to continuously measure the current flowing to the at least one GFCI breaker; and
    a user interface assembly disposed, at least in part, outside the cavity, wherein the user interface assembly is coupled to the sensing circuit assembly,
    wherein the controller operates the at least one switch based on a selection made on the user interface assembly, wherein the controller tests, using the at least one second current measuring device and based on the selection, the at least one GFCI breaker to determine a level of leakage current at which the at least one GFCI breaker trips.

2. The system of claim 1, wherein the enclosure is an explosion-proof enclosure.

3. The system of claim 1, wherein the sensing circuit assembly is disposed within the cavity of the enclosure.

4. The system of claim 1, wherein the controller measures, stores, and analyzes a plurality of data over time, wherein the plurality of data is associated with operation and performance of the at least one GFCI breaker based on measurements by the at least one second current measuring device.

5. The system of claim 1, wherein the controller is disposed within an aperture in the at least one wall of the enclosure.

6. The system of claim 5, wherein the user interface assembly comprises a shaft that traverses the aperture, wherein the controller is disposed within the shaft.

7. The system of claim 6, wherein the shaft of the user interface assembly comprises an outer surface having mating threads disposed thereon, wherein the mating threads couple to complementary mating threads that define the aperture in the at least one wall of the enclosure.

8. The system of claim 1, wherein at least a portion of the user interface assembly is mounted on an outer surface of the at least one wall of the enclosure, wherein the at least the portion of the user interface assembly comprises the controller.

9. A user interface assembly, comprising:
    a controller coupled to the user interface, wherein the controller is configured to communicate with a sensing circuit assembly disposed within a cavity of an enclosure, wherein the sensing circuit assembly comprises at least one switch and at least one first current measuring device that continuously measures current flowing to at least one circuit breaker, wherein the controller instructs the at least one switch to operate so that the at least one circuit breaker disposed within the cavity of the enclosure is tested; and
    a user interface assembly coupled to the controller, wherein the user interface communicates with a user regarding the at least one circuit breaker disposed within the cavity of the enclosure,
    wherein the at least one circuit breaker comprises a second current measuring device that measures the current flowing through the at least one circuit breaker, wherein the at least one circuit breaker opens when a leakage current exceeds a threshold value,
    wherein the controller, using the at least one current measuring device, is configured to test the at least one circuit breaker to determine the threshold value at which the at least one circuit breaker trips.

10. The user interface assembly of claim 9, wherein the user interface assembly comprises at least one light source and a user interface device.

11. The user interface assembly of claim 10, wherein the user interface device comprises a dial.

12. The user interface assembly of claim 11, wherein the dial comprises a rotatable guard that defines an outer perimeter of the user interface assembly.

13. The user interface assembly of claim 10, wherein the user interface device comprises a pushbutton.

14. The user interface assembly of claim 10, wherein the user interface device comprises a touchpad.

15. The user interface assembly of claim 10, further comprising:
    a protective device that covers at least a portion of the user interface assembly, wherein the protective device is impact resistant.

16. The user interface assembly of claim 15, wherein the protective device covers the at least one light source, wherein light emitted by the at least one light source is visible through the protective device.

17. The user interface assembly of claim 15, wherein the controller is disposed between an outer surface of the enclosure and the protective device.

18. The user interface assembly of claim 9, wherein the user interface assembly is configured to be mounted on an outer surface of an enclosure cover of the enclosure.

19. A sensing circuit assembly, comprising:
a circuit board disposed within a cavity of an enclosure;
a plurality of first current measuring devices that are configured to continuously measure current flowing to a plurality of GFCI breakers; and
a plurality of switches disposed on the circuit board, wherein each switch of the plurality of switches is electrically coupled to each GFCI breaker of the plurality of GFCI breakers, wherein each GFCI breaker of the plurality of GFCI breakers is disposed within the cavity of the enclosure,
wherein the plurality of switches is configured to be coupled to a controller, wherein the controller is configured to further be coupled to a user interface assembly, wherein the controller is configured to operate at least one of the plurality of switches based on instructions received from the user interface assembly to test at least one of the plurality of GFCI breakers, wherein at least one of the plurality of first current measuring devices measures the current during testing,
wherein the plurality of GFCI breakers comprise a plurality of second current measuring devices that measure the current flowing through the plurality of GFCI breakers, wherein each GFCI breaker of the plurality of GFCI breakers opens when a leakage current exceeds a threshold value,
wherein the controller, using the plurality of first current measuring devices, is configured to test the plurality of GFCI breakers to determine the threshold value at which the plurality of GFCI breakers trips.

20. The sensing circuit assembly of claim 19, wherein the controller is further configured to communicate operational information regarding the plurality of GFCI breakers using measurements by the plurality of first current measuring devices.

* * * * *